United States Patent
Qin et al.

(10) Patent No.: US 11,703,905 B1
(45) Date of Patent: Jul. 18, 2023

(54) CLOCK GENERATION CIRCUIT, EQUIDISTANT FOUR-PHASE SIGNAL GENERATION METHOD, AND MEMORY

(71) Applicant: CHANGXIN MEMORY TECHNOLOGIES, INC., Hefei (CN)

(72) Inventors: Jianyong Qin, Hefei (CN); Jianni Li, Hefei (CN); Zhonglai Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/866,682

(22) Filed: Jul. 18, 2022

Related U.S. Application Data

(63) Continuation of application No. PCT/CN2022/093711, filed on May 19, 2022.

(30) Foreign Application Priority Data

Apr. 26, 2022 (CN) .......................... 202210450134.8

(51) Int. Cl.
*G06F 1/06* (2006.01)
*H03K 3/86* (2006.01)
(Continued)

(52) U.S. Cl.
CPC ................ *G06F 1/06* (2013.01); *H03K 3/86* (2013.01); *H03K 5/05* (2013.01); *H03K 5/06* (2013.01); *H03K 19/1776* (2013.01)

(58) Field of Classification Search
CPC ................ G06F 1/04; G06F 1/06; H03K 3/86
(Continued)

(56) References Cited

U.S. PATENT DOCUMENTS 6,671,652 B2 * 12/2003 Watson, Jr. ...... G01R 31/31725
702/177
6,721,114 B1 * 4/2004 Sutardja ................... G11B 5/09
(Continued)

FOREIGN PATENT DOCUMENTS

CN 1416215 A 5/2003
CN 1677820 A 10/2005
(Continued)

OTHER PUBLICATIONS

JEDEC JESD209-4B, "Low Power Double Data Rate 4 (LPDDR4)", Jedec Solid State Technology Association, Feb. 2017, 307 pages.
(Continued)

*Primary Examiner* — William Hernandez
(74) *Attorney, Agent, or Firm* — Cooper Legal Group, LLC

(57) ABSTRACT

A clock generation circuit, equidistant four-phase signal generation method and memory are provided. The circuit includes: a four-phase clock generation circuit for receiving an internal clock signal and complementary clock signal of a memory to which the clock generation circuit belongs, configured to generate a first, second, third and fourth clock signals with the same cycle; a signal delay circuit configured to perform signal delay on the first clock signal, second clock signal, third clock signal and fourth clock signal respectively based on the delay command, herein the delays of the first clock signal, second clock signal, third clock signal and fourth clock signal are different; a signal loading circuit configured to generate a first indication signal and second indication signal; and a test circuit configured to perform a duty cycle test based on the first indication signal and second indication signal to acquire equidistant parallel clock signals.

15 Claims, 10 Drawing Sheets

(51) Int. Cl.
*H03K 5/06* (2006.01)
*H03K 19/1776* (2020.01)
*H03K 5/05* (2006.01)

(58) Field of Classification Search
USPC .................................. 327/175, 291, 295, 297
See application file for complete search history.

(56) References Cited

U.S. PATENT DOCUMENTS

| | | |
|---|---|---|
| 6,927,641 B2 | 8/2005 | Terasawa |
| 7,567,118 B2 | 7/2009 | Azuma |
| 9,448,274 B2 | 9/2016 | Pounds |
| 10,164,572 B2 | 12/2018 | Chen |
| 10,885,989 B1 | 1/2021 | Moon |
| 11,005,479 B2 | 5/2021 | Im |
| 11,349,457 B2 | 5/2022 | Kim |
| 11,496,136 B1 * | 11/2022 | Park .......................... G06F 1/06 |
| 2003/0020529 A1 * | 1/2003 | Nakanishi ............ H03K 5/1506 |
| | | 327/295 |
| 2003/0098749 A1 | 5/2003 | Terasawa et al. |
| 2003/0219089 A1 * | 11/2003 | Ho ........................ H03L 7/0816 |
| | | 327/158 |
| 2005/0094448 A1 | 5/2005 | Lee |
| 2005/0218966 A1 | 10/2005 | Azuma |
| 2007/0223638 A1 | 9/2007 | Okamura |
| 2007/0271068 A1 | 11/2007 | Boerstler et al. |
| 2008/0005606 A1 | 1/2008 | Koo |
| 2010/0219870 A1 | 9/2010 | Kikuchi |
| 2011/0156757 A1 * | 6/2011 | Hayashi ........... G01R 31/31726 |
| | | 327/161 |
| 2011/0181308 A1 | 7/2011 | Ishida |
| 2015/0301104 A1 | 10/2015 | Pounds et al. |
| 2017/0222796 A1 * | 8/2017 | Chen .................... H04L 7/0337 |
| 2018/0054163 A1 | 2/2018 | Chen et al. |
| 2019/0181847 A1 * | 6/2019 | Satoh ....................... G11C 7/12 |
| 2020/0336148 A1 | 10/2020 | Im et al. |
| 2022/0094339 A1 | 3/2022 | Kim et al. |
| 2022/0130439 A1 | 4/2022 | Tian et al. |
| 2022/0247390 A1 | 8/2022 | Kim et al. |

FOREIGN PATENT DOCUMENTS

| | | |
|---|---|---|
| CN | 101826860 A | 9/2010 |
| CN | 101410719 B | 1/2012 |
| CN | 102638247 A | 8/2012 |
| CN | 103840796 A | 6/2014 |
| CN | 103997317 A | 8/2014 |
| CN | 104753524 A | 7/2015 |
| CN | 106233150 A | 12/2016 |
| CN | 107153138 A | 9/2017 |
| CN | 109274356 A | 1/2019 |
| CN | 209087409 U | 7/2019 |
| CN | 111161771 A | 5/2020 |
| CN | 111193498 A | 5/2020 |
| CN | 210899108 U | 6/2020 |
| CN | 111835349 A | 10/2020 |
| CN | 111863048 A | 10/2020 |
| CN | 112420113 A | 2/2021 |
| CN | 113346739 A | 9/2021 |
| CN | 113764028 A | 12/2021 |
| CN | 215773547 U | 2/2022 |
| CN | 114257235 A | 3/2022 |
| CN | 114420187 A | 4/2022 |
| EP | 3886099 A1 | 9/2021 |
| WO | 2015037252 A1 | 3/2015 |

OTHER PUBLICATIONS

JEDEC JESD209-5B, "Low Power Double Data Rate 5 (LPDDR5)", Jedec Solid State Technology Association, Jun. 2021, 622 pages.
Kim, et al., "A 20-GB/s 256-Mb DRAM with an Inductorless Quadrature PLL and a Cascaded Pre-emphasis Transmitter," IEEE Journal of Solid-State Circuits, vol. 41, No. 1, JSSC, Jan. 2006, 8 pages.

* cited by examiner

CLOCK GENERATION CIRCUIT, EQUIDISTANT FOUR-PHASE SIGNAL GENERATION METHOD, AND MEMORY

CROSS-REFERENCE TO RELATED APPLICATION

This application is a continuation application of International Patent Application No. PCT/CN2022/093711, filed on May 19, 2022, which is based upon and claims priority to Chinese Patent Application No. 202210450134.8, filed on Apr. 26, 2022 and entitled "CLOCK GENERATION CIRCUIT, EQUIDISTANT FOUR-PHASE SIGNAL GENERATION METHOD, AND MEMORY". The disclosures of International Patent Application No. PCT/CN2022/093711 and Chinese Patent Application No. 202210450134.8 are hereby incorporated by reference in their entireties.

BACKGROUND

With the progress of technology, high-tech products are constantly updated, and the product performance is continuously improved. The work of the high-tech products depends on the storage of data by a memory. Therefore, it is an urgent problem to improve the data access rate and the data access stability of the memory.

The data processing of the memory will use a clock signal, and the transmission frequency of the clock signal determines the number of operations performed by the memory within the same time, that is, the transmission frequency of the clock signal determines the data processing speed of the memory. That is, the memory performs data processing based on a high-speed clock signal, which is of great significance to improve the performance of the memory.

How to test whether the duty cycle of the high-speed clock signal meets the requirements, how to ensure the accuracy of the test of the high-speed clock signal, and how to generate equidistant parallel clock signals based on the high-speed clock signal are urgent problems to be solved at present.

SUMMARY

The disclosure relates to the field of semiconductor circuit designs, and in particular, to a clock generation circuit, an equidistant four-phase signal generation method, and a memory.

The embodiments of the disclosure provide a clock generation circuit, which may include: a four-phase clock generation circuit for receiving an internal clock signal and a complementary clock signal of a memory to which the clock generation circuit belongs, configured to generate a first clock signal, a second clock signal, a third clock signal, and a fourth clock signal with the same cycle based on the internal clock signal and the complementary clock signal, herein the internal clock signal and the complementary clock signal are reverse signals, the cycle of the first clock signal is K times the cycle of the internal clock signal, K is a positive integer, and the value of K depends on the signal delay inside the four-phase clock generation circuit; a signal delay circuit for receiving the first clock signal, the second clock signal, the third clock signal, the fourth clock signal, and the delay command, configured to perform signal delay on the first clock signal, the second clock signal, the third clock signal, and the fourth clock signal respectively based on the delay command, herein the delays of the first clock signal, the second clock signal, the third clock signal, and the fourth clock signal are different; a signal loading circuit, connected to the signal delay circuit, and configured to generate a first indication signal and a second indication signal based on the delayed first clock signal, the delayed second clock signal, the delayed third clock signal, and the delayed fourth clock signal; and a test circuit, connected to the signal loading circuit, and configured to perform a duty cycle test based on the first indication signal and the second indication signal.

In addition, the delay command may include a first delay command, a second delay command, a third delay command, and a fourth delay command. The signal delay circuit may include a first delay subcircuit, a second delay subcircuit, a third delay subcircuit, and a fourth delay subcircuit, herein the first delay subcircuit may be configured to perform signal delay on the first clock signal according to the first delay command, the second delay subcircuit may be configured to perform signal delay on the second clock signal according to the second delay command, the third delay subcircuit may be configured to perform signal delay on the third clock signal according to the third delay command, and the fourth delay subcircuit may be configured to perform signal delay on the fourth clock signal according to the fourth delay command.

In addition, the first delay subcircuit may include: a first one-delay phase inverter, herein an input end may be configured to receive the first clock signal; a first two-delay phase inverter, herein an input end may be connected to an output end of the first one-delay phase inverter; a first three-delay phase inverter, herein an input end may be connected to an output end of the first two-delay phase inverter; a first four-delay phase inverter, herein an input end may be connected to an output end of the first three-delay phase inverter, and an output end may be configured to output the delayed first clock signal; a first charging and discharging module, herein one end may be connected to the output end of the first one-delay phase inverter, the other end may be coupled to a low-potential power node, and the low-potential power node may be configured to receive a low level; a fifth charging and discharging module, herein one end may be connected to the output end of the first two-delay phase inverter, and the other end may be coupled to the low-potential power node, herein the charging and discharging capacity of the first charging and discharging module and the fifth charging and discharging module may be adjusted according to the first delay command.

In addition, the second delay subcircuit may include: a second one-delay phase inverter, herein an input end may be configured to receive the second clock signal; a second two-delay phase inverter, herein an input end may be connected to an output end of the second one-delay phase inverter; a second three-delay phase inverter, herein an input end may be connected to an output end of the second two-delay phase inverter; a second four-delay phase inverter, herein an input end may be connected to an output end of the second three-delay phase inverter, and an output end may be configured to output the delayed second clock signal; a second charging having discharging module, herein one end may be connected to the output end of the second one-delay phase inverter, the other end may be coupled to a low-potential power node, and the low-potential power node may be configured to receive a low level; a sixth charging and discharging module, herein one end may be connected to the output end of the second two-delay phase inverter, and the other end may be coupled to the low-potential power node, herein the charging and discharging capacity of the second charging having discharging module and the sixth charging and discharging module may be adjusted according to the second delay command.

In addition, the third delay subcircuit may include: a third one-delay phase inverter, herein an input end may be configured to receive the third clock signal; a third two-delay phase inverter, herein an input end may be connected to an output end of the third one-delay phase inverter; a third three-delay phase inverter, herein an input end may be connected to an output end of the third two-delay phase inverter; a third four-delay phase inverter, herein an input end may be connected to an output end of the third three-delay phase inverter, and an output end may be configured to output the third clock signal after delaying; a third charging and discharging module, herein one end may be connected to the output end of the third one-delay phase inverter, the other end may be coupled to a low-potential power node, and the low-potential power node may be configured to receive a low level; a seventh charging and discharging module, herein one end may be connected to the output end of the third two-delay phase inverter, and the other end may be coupled to the low-potential power node, herein the charging and discharging capacity of the third charging and discharging module and the seventh charging and discharging module may be adjusted according to the third delay command.

In addition, the fourth delay subcircuit may include: a fourth one-delay phase inverter, herein an input end may be configured to receive the fourth clock signal; a fourth two-delay phase inverter, herein an input end may be connected to an output end of the fourth one-delay phase inverter; a fourth three-delay phase inverter, herein an input end may be connected to an output end of the fourth two-delay phase inverter; a fourth four-delay phase inverter, herein an input end may be connected to an output end of the fourth three-delay phase inverter, and an output end may be configured to output the delayed fourth clock signal a fourth charging and discharging module, herein one end may be connected to the output end of the fourth one-delay phase inverter, the other end may be coupled to a low-potential power node, and the low-potential power node may be configured to receive a low level; an eighth charging and discharging module, herein one end may be connected to the output end of the fourth two-delay phase inverter, and the other end may be coupled to the low-potential power node, herein the charging and discharging capacity of the fourth charging and discharging module and the eighth charging and discharging module may be adjusted according to the fourth delay command.

In addition, the signal loading circuit may include: a data generation module, configured to generate four-bit first loading data and second loading data; a data loading module, configured to sample the first loading data to generate the first indication signal according to the first delayed clock signal, the second delayed clock signal, the third delayed clock signal, or the fourth delayed clock signal, herein when the first loading data corresponding to a clock signal sampling edge is a high level, the generated first indication signal is a high level. The data loading module may also configured to sample the second loading data to generate the second indication signal according to the first delayed clock signal, the second delayed clock signal, the third delayed clock signal, or the fourth delayed clock signal, herein when the second loading data corresponding to a clock signal sampling edge is a high level, the generated second indication signal is a high level.

In addition, the test circuit may include: a first integrating circuit for receiving the first indication signal, configured to integrate a first test signal to output a first integrated signal; a second integrating circuit for receiving the second indication signal, configured to integrate a second test signal to output a second first integrated signal, herein the voltage value of the first integrated signal may be a product of the duty cycle of the first indication signal and the power amplitude value, and the voltage value of the second integrated signal may be a product of the duty cycle of the second indication signal and the power amplitude value; and a comparison circuit, herein an input end may be connected to the first integrating circuit, and the other input end may be connected to the second integrating circuit. The comparison circuit may be configured to compare the size of the first integrated signal and the size of the second integrated signal, output a high level signal when the first integrated signal is greater than the second integrated signal, and output a low level signal when the second integrated signal is greater than the first integrated signal.

In addition, the first integrating circuit may include: a filter unit, a first pre-processing unit, and a second pre-processing unit. The first filter unit may be configured to integrate the received signal. The first pre-processing unit may include: a first on-transistor, a first pre-charge P transistor, and a first pre-charge N transistor. A drain of the first on-transistor may be configured to receive the first indication signal, a source may be connected to an input end of the first filter unit, and a gate may be configured to receive a first switching signal. A source of the first pre-charge P transistor is configured to receive a high level, a drain may be connected to an input end of the first filter unit, and a gate may be configured to receive an integrated charge signal. A source of the first pre-charge N transistor may be configured to receive a low level, a drain may be connected to an input end of the first filter unit, and a gate may be configured to receive a first integrated discharge signal. The second pre-processing unit may include: a second on-transistor, a second pre-charge P transistor, and a second pre-charge N transistor, herein a drain of the second on-transistor may be connected to an output end of the first filter unit, a source may be configured to output the first integrated signal, and a gate may be configured to receive a second switching signal. A source of the second pre-charge P transistor may be configured to receive a high level, a drain may be connected to an output end of the first filter unit, and a gate may be configured to receive the integrated charge signal. A source of the second pre-charge N transistor may be configured to receive a low level, a drain may be connected to an input end of the first filter unit, and a gate may be configured to receive the first integrated discharge signal.

In addition, the second integrating circuit may include: a filter unit, a third pre-processing unit, and a fourth pre-processing unit. The second filter unit may be configured to integrate the received signal. The third pre-processing unit may include: a third on-transistor, a third pre-charge P transistor, and a third pre-charge N transistor. A drain of the third on-transistor may be configured to receive the second indication signal, a source may be connected to an input end of the third filter unit, and a gate may be configured to receive a first switching signal. A source and a gate of the third pre-charge P transistor may be connected and may be configured to receive a high level, and a drain may be connected to an input end of the second filter unit. A source of the third pre-charge N transistor may be configured to receive a low level, a drain may be connected to an input end of the filter unit, and a gate may be configured to receive a second integrated discharge signal. The fourth pre-processing unit may include: a fourth on-transistor, a fourth pre-charge P transistor, and a fourth pre-charge N transistor. A drain of the fourth on-transistor may be connected to an output end of the second filter unit, a source may be configured to output the second integrated signal, and a gate may be configured to receive a second switching signal. A source and a gate of the fourth pre-charge P transistor may be connected and may be configured to receive a high level, and a drain may be connected to an output end of the filter unit. A source of the fourth pre-charge N transistor may be configured to receive a low level, a drain may be connected to an input end of the second filter unit, and a gate may be configured to receive the second integrated discharge signal.

The embodiments of the disclosure further provide an equidistant four-phase signal generation method, which may be applied to a clock generation circuit provided by the abovementioned embodiments. The method may include that: a first indication signal is generated based on a first clock signal, a second clock signal, and a third clock signal, a second indication signal is generated based on the third clock signal, a fourth clock signal, and the first clock signal, and a relationship between sizes of duty cycles of the first indication signal and the second indication signal is acquired based on a test circuit; if a duty cycle of the first indication signal is different from a duty cycle of the second indication signal, the delay of the first clock signal, the second clock signal, and the third clock signal performed by the signal delay circuit is adjusted based on a delay command; a third indication signal is generated based on the first clock signal and the second clock signal, a fourth indication signal is generated based on the second clock signal and the third clock signal, and a relationship between sizes of duty cycles of the third indication signal and the fourth indication signal is acquired based on the test circuit; if a duty cycles of the third indication signal is different from a duty cycle of the fourth indication signal, the delay of the first clock signal and the second clock signal performed by the signal delay circuit is adjusted based on a delay command; a fifth indication signal is generated based on the third clock signal and the fourth clock signal, a sixth indication signal is generated based on the fourth clock signal and the first clock signal, and a relationship between sizes of duty cycles of the fifth indication signal and the sixth indication signal is acquired based on the test circuit; and if a duty cycle of the fifth indication signal is different from a duty cycle of the sixth indication signal, the delay of the third clock signal and the fourth clock signal performed by the signal delay circuit is adjusted based on a delay command.

In addition, the operation that the delay of the first clock signal, the second clock signal, and the third clock signal performed by the signal delay circuit is adjusted based on a delay command may include that: the delay to the first clock signal is increased and simultaneously the delays to the second clock signal and the third clock signal are decreased if an output signal of the test circuit is a high level; and the delay to the first clock signal is decreased and simultaneously the delays to the second clock signal and the third clock signal are increased if the output signal of the test circuit is a low level.

In addition, the operation that the delay of the first clock signal and the second clock signal performed by the signal delay circuit is adjusted based on a delay command may include that: the delay to the first clock signal is increased and simultaneously the delay to the second clock signal if an output signal of the test circuit is a high level are decreased; and the delay to the first clock signal is decreased and simultaneously the delay to the second clock signal is increased if the output signal of the test circuit is a low level, herein the total signal delay of the first clock signal and the second clock signal is constant.

In addition, the operation that the delay of the third clock signal and the fourth clock signal performed by the signal delay circuit is adjusted based on a delay command may include that: the delay to the third clock signal is decreased and simultaneously the delay to the fourth clock signal is increased if the output signal of the test circuit is a high level; and the delay to the third clock signal is increased and simultaneously the delay to the fourth clock signal is decreased if an output signal of the test circuit is a low level, herein the total signal delay of the third clock signal and the fourth clock signal is constant.

BRIEF DESCRIPTION OF THE DRAWINGS

One or more embodiments are exemplarily described by the pictures in the corresponding accompanying drawings, and these exemplary descriptions do not constitute a limitation to the embodiments. Unless otherwise stated, the figures in the accompanying drawings do not constitute a proportional limitation. In order to more clearly illustrate the embodiments of the disclosure or the technical solutions in the prior art, the drawings used in the description of the embodiments will be briefly described below. It is apparent that the accompanying drawings in the following description are only some embodiments of the disclosure, and other drawings can be obtained by those skilled in the art according to these drawings without any creative work.

DETAILED DESCRIPTION

How to test whether the duty cycle of the high-speed clock signal meets the requirements, how to ensure the accuracy of the test of the high-speed clock signal, and how to generate equidistant parallel clock signals based on the high-speed clock signal are urgent problems to be solved at present.

An embodiment of the disclosure provides clock generation circuit, which acquires equidistant parallel clock signals based on an accurate duty cycle test method.

Those of ordinary skill in the art can understand that in various embodiments of the disclosure, many technical details have been proposed in order to make a reader better understand the disclosure. However, the technical solutions claimed in the disclosure can also be realized even without these technical details and various changes and modifications based on the following embodiments. The following embodiments are divided for convenience of description and shall not constitute any limitation to the specific implementation mode of the disclosure. The embodiments can be combined and referred to each other without contradiction.

Figure 1:
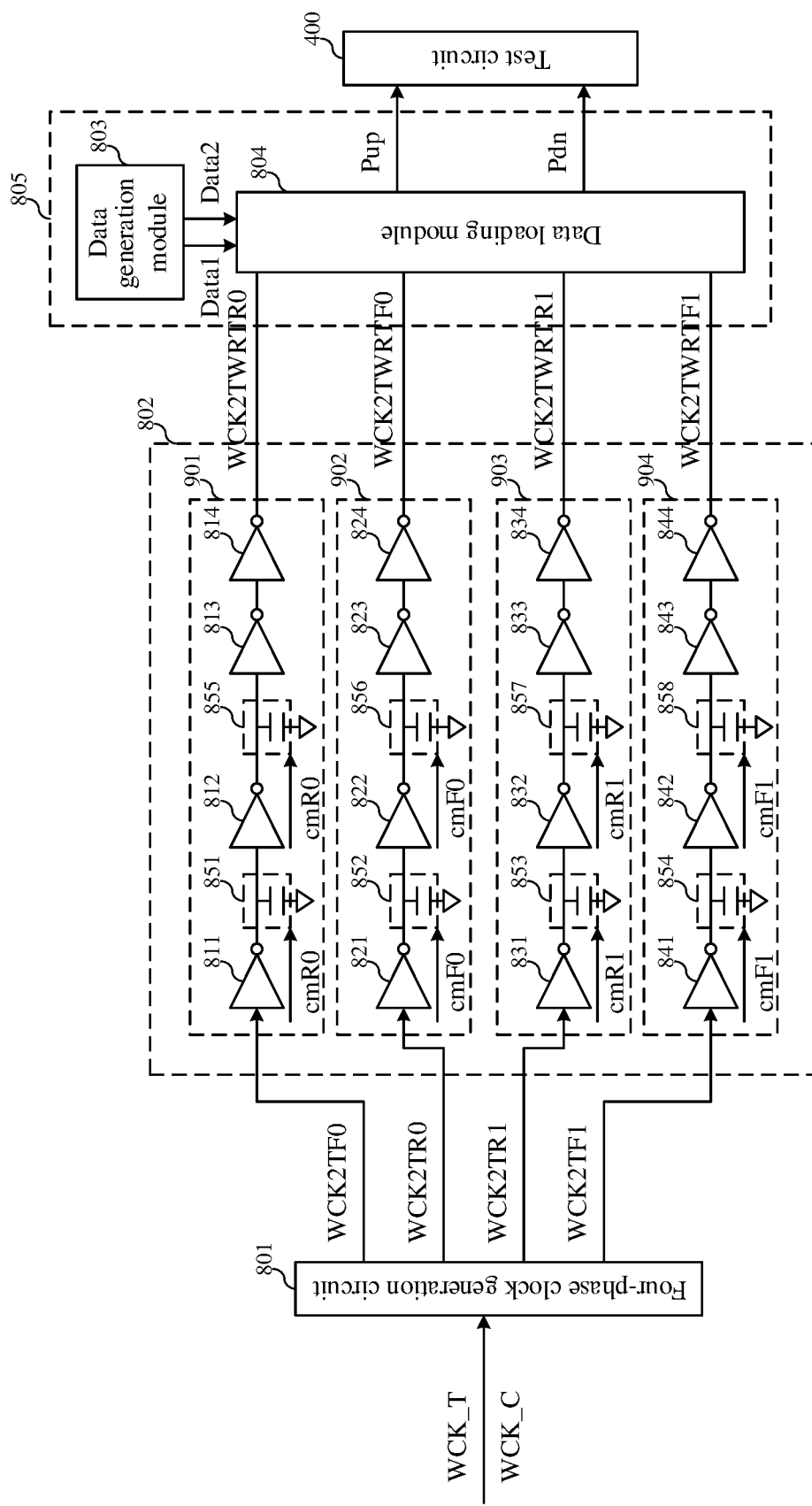
FIG. 1 illustrates a schematic structural diagram of clock generation circuit provided by an embodiment of the disclosure.
Figure 2:
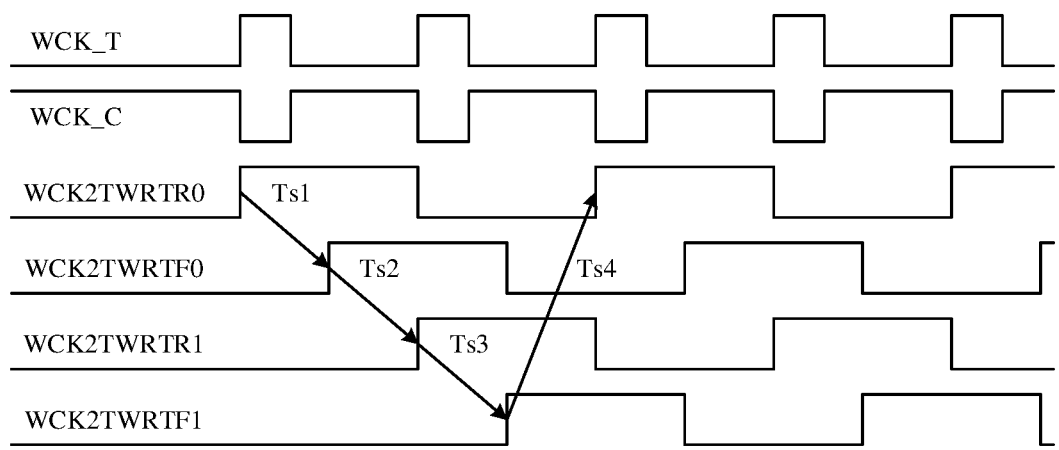
FIG. 2 illustrates a timing schematic diagram of a four-phase signal provided by an embodiment of the disclosure.
Figure 3:
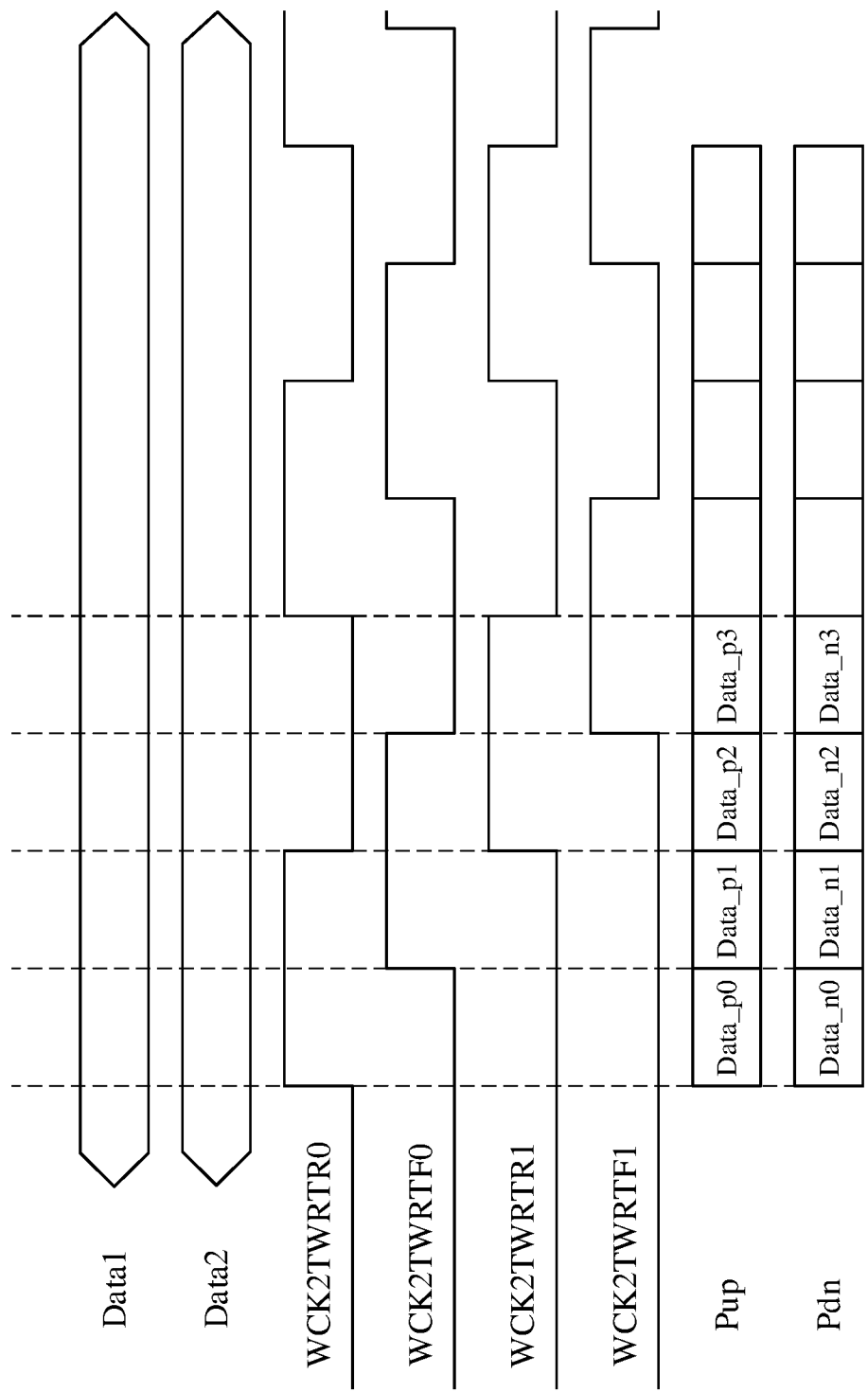
FIG. 3 illustrates a timing schematic diagram of generating equidistant four-phase signals provided by an embodiment of the disclosure.
Figure 4:
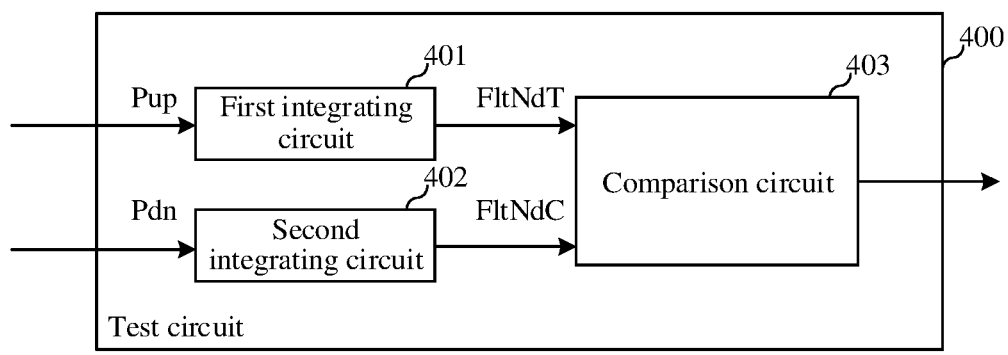
FIG. 4 illustrates a schematic structural diagram of a test circuit provided by an embodiment of the disclosure.
Figure 5:
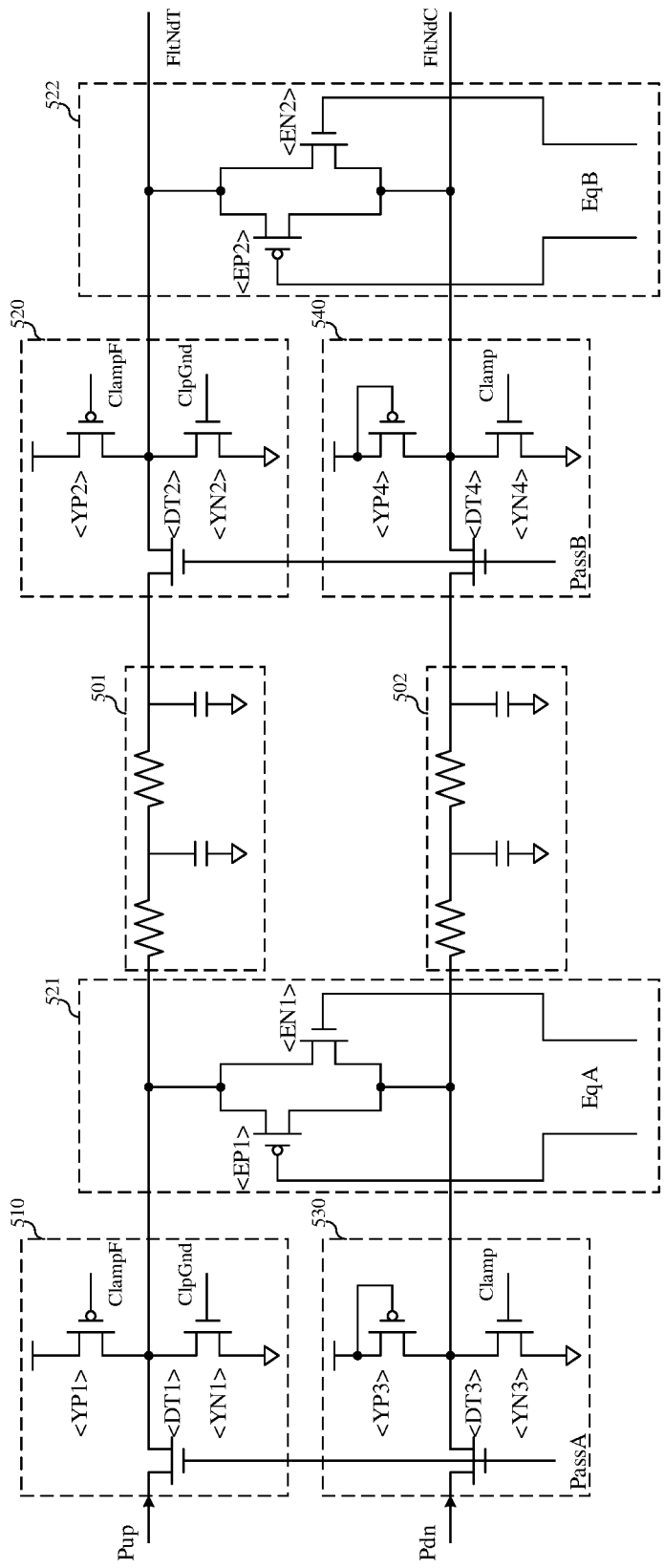
FIG. 5 illustrates schematic structural diagrams of a first integrating circuit and a second integrating circuit provided by an embodiment of the disclosure.
Figure 6:
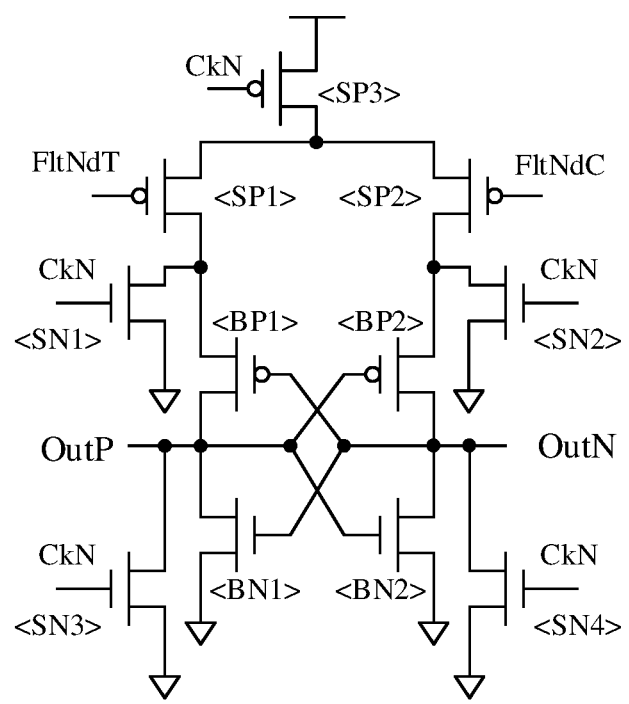
FIG. 6 illustrates a schematic structural diagram of a comparison circuit provided by an embodiment of the disclosure.
Figure 7:
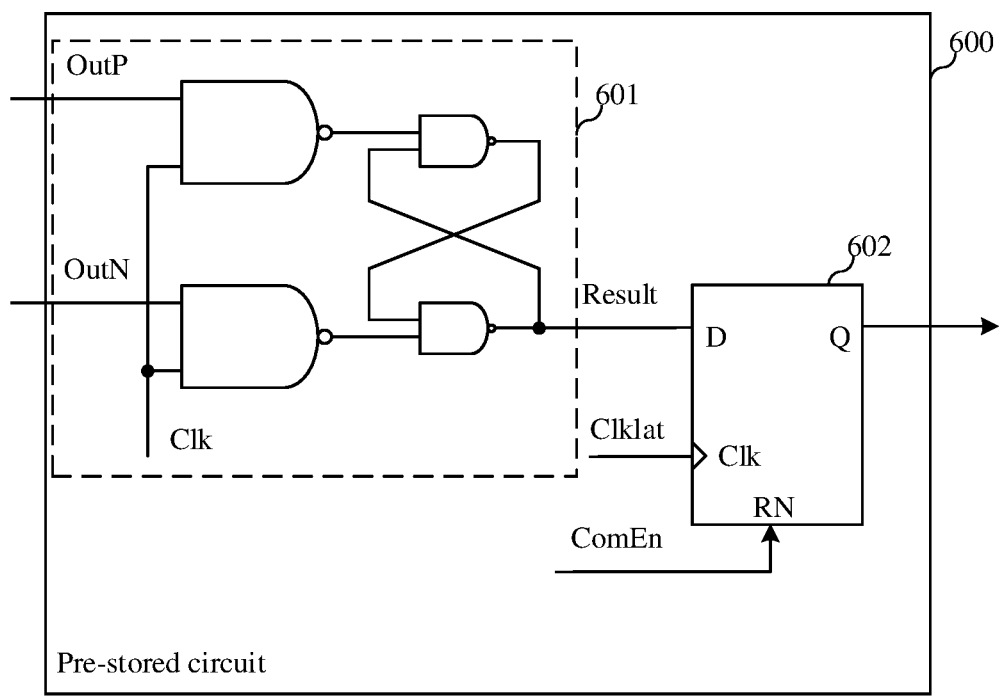
FIG. 7 illustrates a schematic structural diagram of a pre-stored circuit provided by an embodiment of the disclosure.
Figure 8:
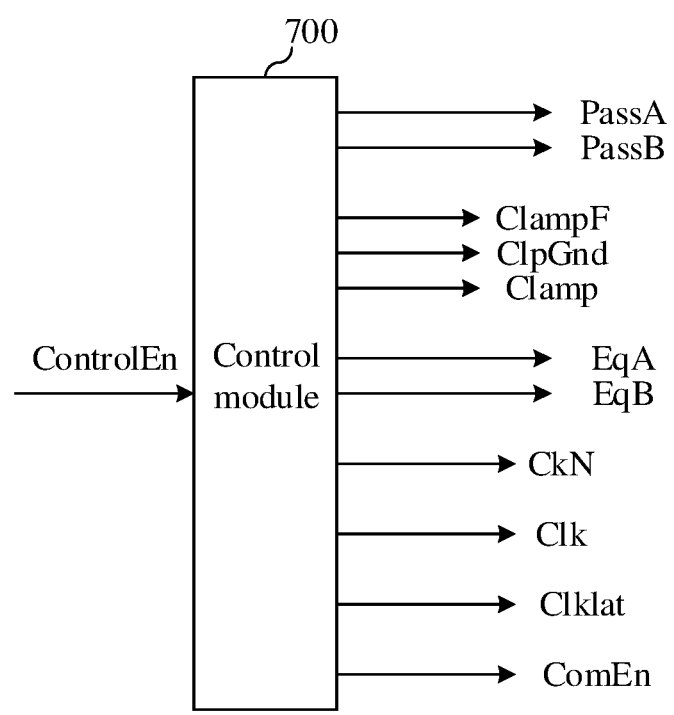
FIG. 8 illustrates a control logic schematic diagram of a control module provided by an embodiment of the disclosure.
Figure 9:
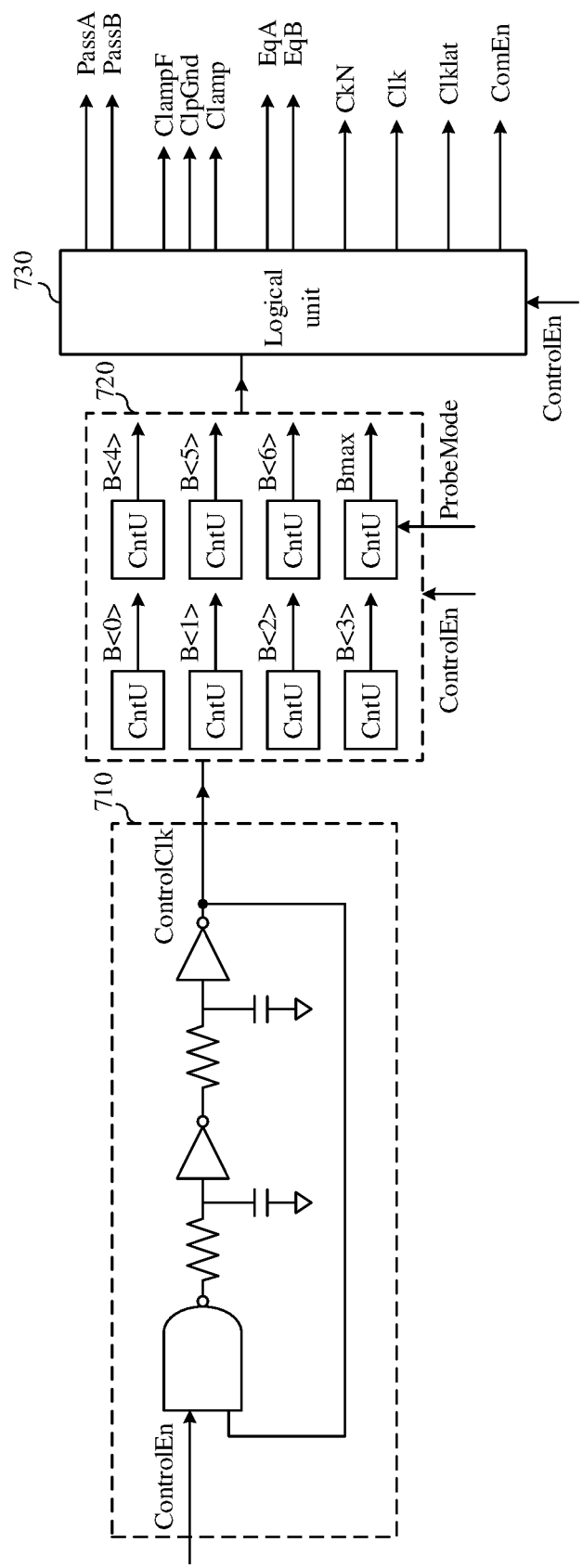
FIG. 9 is a schematic structural diagram of a control module provided by an embodiment of the disclosure.

FIG. 1 illustrates a schematic structural diagram of clock generation circuit provided by an embodiment of the disclosure. FIG. 2 illustrates a timing schematic diagram of a four-phase signal provided by an embodiment of the disclosure. FIG. 3 illustrates a timing schematic diagram of generating equidistant four-phase signals provided by an embodiment of the disclosure. FIG. 4 illustrates a schematic structural diagram of a test circuit provided by an embodiment of the disclosure. FIG. 5 illustrates schematic structural diagrams of a first integrating circuit and a second integrating circuit provided by an embodiment of the disclosure. FIG. 6 illustrates a schematic structural diagram of a comparison circuit provided by an embodiment of the disclosure. FIG. 7 illustrates a schematic structural diagram of a pre-stored circuit provided by an embodiment of the disclosure. FIG. 8 illustrates a control logic schematic diagram of a control module provided by an embodiment of the disclosure. FIG. 9 is a schematic structural diagram of a control module provided by an embodiment of the disclosure. The clock generation circuit provided by the embodiment of the disclosure is further described in detail in combination with accompanying drawings, which are as follows specifically.

Referring to FIG. 1, a signal generation circuit, includes: a four-phase clock generation circuit 801.

The four-phase clock generation circuit 801 is configured to receive an internal clock signal WCK_T and a complementary clock signal WCK_C of a memory to which the clock generation circuit belongs. The four-phase clock generation circuit 801 is configured to generate a first clock signal WCK2TR0, a second clock signal WCK2TF0, a third clock signal WCK2TR1, and a fourth clock signal WCK2TF1 with the same cycle based on the internal clock signal WCK_T and the complementary clock signal WCK_C.

The internal clock signal WCK_T and the complementary clock signal WCK_C are reverse signals, the cycle of the first clock signal WCK2TR0 is K times the cycle of the internal clock signal WCK_T, K is a positive integer, and the value of K depends on the signal delay inside the four-phase clock generation circuit 801.

In an example, the signal delay inside the four-phase clock generation circuit 801 is great, and the value of K corresponding to the four-phase clock generation circuit 801 is great. At this moment, the cycle of the generated first clock signal WCK2TR0 may be more than 5 times the cycle of the internal clock signal WCK_T. In another example, the signal delay inside the four-phase clock generation circuit 801 is small, and the value of K corresponding to the four-phase clock generation circuit 801 is small. At this moment, the cycle of the generated first clock signal WCK2TR0 may be less than 4 times the cycle of the internal clock signal WCK_T. Referring to FIG. 2, it is to be noted that, a memory generally adopts double-edge sampling, that is, data sampling is performed at both a rising edge and a falling edge of a signal, that is, data is transmitted twice in a clock cycle. After the signal is split into four phase clocks subsequently, if the sampling is performed once based on each clock, then the four phase clocks correspond to the sampling times of the internal clock signal WCK_T in two cycles. Therefore, in the present embodiment, specific description is performed by taking the cycle of the first clock signal WCK2TR0 being twice (that is, k=2) the cycle of the internal clock signal WCK_T as an example, which does not constitute a limitation to the present embodiment. The signal delay of the four-phase clock generation circuit 801 may be set correspondingly according to the frequency of the clock required to be generated and the frequency of the internal clock signal WCK_T inside the memory in specific use.

It can be understood that the cycles of the first clock signal WCK2TR0, the second clock signal WCK2TF0, the third clock signal WCK2TR1, and the fourth clock signal WCK2TF1 are the same, at this moment, the cycles of the second clock signal WCK2TF0, the third clock signal WCK2TR1, and the fourth clock signal WCK2TF1 are also twice the cycle of the internal clock signal WCK_T.

Continuing to refer to FIG. 1, a signal delay circuit 802 is configured to receive the first clock signal WCK2TR0, the second clock signal WCK2TF0, the third clock signal WCK2TR1, the fourth clock signal WCK2TF1, and a delay command. The signal delay circuit 802 is configured to perform signal delay on the first clock signal WCK2TF0, the second clock signal WCK2TR0, the third clock signal WCK2TR1, and the fourth clock signal WCK2TF1 respectively based on the delay command cm, and the delays of the first clock signal WCK2TF0, the second clock signal WCK2TR0, the third clock signal WCK2TR1, and the fourth clock signal WCK2TF1 are different.

Specifically, the signal delay circuit 802 generates a first delay clock signal WCK2TWRTR0 after delaying the first clock signal WCK2TR0, generates a second delay clock signal WCK2TWRTF0 after delaying the second clock signal WCK2TF0, generates a third delay clock signal WCK2TWRTR1 after delaying the third clock signal WCK2TR1, and generates a fourth delay clock signal WCK2TWRTF1 after delaying the fourth clock signal WCK2TF1. Referring to FIG. 2, the delay of the second delay clock signal WCK2TWRTF0 relative to the first delay clock signal WCK2TWRTR0 is Ts1, the delay of the third delay clock signal WCK2TWRTR1 relative to the second delay clock signal WCK2TWRTF0 is Ts2, the delay of the fourth delay clock signal WCK2TWRTF1 relative to the third delay clock signal WCK2TWRTR1 is Ts3, and the delay of the first delay clock signal WCK2TWRTR0 relative to the fourth delay clock signal WCK2TWRTF1 is Ts4.

In an ideal case, equidistant (Ts1=Ts2=Ts3=Ts4) four-phase clock signals may be generated through the signal delay circuit 802. However, due to actual device deviation and the like, the corresponding delays of the four-phase clock signals generated by the signal delay circuit 802 are not equal, that is, Ts1=Ts2=Ts3=Ts4 cannot be guaranteed.

A signal loading circuit 805 is connected to the signal delay circuit 802, and is configured to generate a first indication signal Pup and a second indication signal Pdn based on the delayed first clock signal, the delayed second clock signal, the delayed third clock signal, and the delayed fourth clock signal.

Continuing to refer to FIG. 1, it can be understood that the signal loading circuit 805 generates the first indication signal Pup and the second indication signal Pdn based on the first delay clock signal WCK2TWRTR0, the second delay clock signal WCK2TWRTF0, the third delay clock signal WCK2TWRTR1, and the fourth delay clock signal WCK2TWRTF1.

A test circuit 400 is connected to the signal loading circuit 805 and is configured to perform duty cycle based on the first indication signal Pup and the second indication signal Pdn. Specifically, an output signal of the test circuit 400 is used to characterize the size relationship between the first indication signal Pup and the second indication signal Pdn. If the output signal of the test circuit is a high level, then the first indication signal Pup is greater than the second indication signal Pdn. If the output signal of the test circuit is a low level, then the second indication signal Pdn is greater than the first indication signal Pup.

Specifically, the first indication signal Pup is generated based on the first delay clock signal WCK2TWRTR0, the second delay clock signal WCK2TWRTF0, and the third delay clock signal WCK2TWRTR1 obtained by delaying, and the second indication signal Pdn is generated based on the third delay clock signal WCK2TWRTR1, the fourth delay clock signal WCK2TWRTF1, and the first delay clock signal WCK2TWRTR0 obtained by delaying. It can be known in combination with FIG. 2 that, at this moment, the duty cycle of the first indication signal Pup is (Ts1+Ts2)/(Ts1+Ts2+Ts3+Ts4), and the duty cycle of the second indication signal Pdn is (Ts3+Ts4)/(Ts1+Ts2+Ts3+Ts4). If the output signal of the test circuit 400 is a high level, the duty cycle of the first indication signal Pup is greater than the duty cycle of the second indication signal Pdn, that is, (Ts1+Ts2)>(Ts3+Ts4), at this moment, the delay to the first clock signal may be increased and simultaneously the delays to the second clock signal and the third clock signal may be decreased, that is, Ts1+Ts2 is decreased and Ts3+Ts4 is increased, so that the (Ts1+Ts2)=(Ts3+Ts4), and the sum of the Ts1+Ts2+Ts3+Ts4 is constant to not change the overall cycle of the four-phase clock signal. If the output signal of the test circuit 400 is a low level, the duty cycle of the first indication signal Pup is less than the duty cycle of the second indication signal Pdn, that is, (Ts1+Ts2)<(Ts3+Ts4), at this moment, the delay to the first clock signal may be decreased and simultaneously the delays to the second clock signal and the third clock signal may be increased, that is, Ts1+Ts2 is increased and Ts3+Ts4 is decreased, so that the (Ts1+Ts2)=(Ts3+Ts4), and the sum of the Ts1+Ts2+Ts3+Ts4 is constant to not change the overall cycle of the four-phase clock signal.

It is to be noted that, in the abovementioned example, the sampling of the delay clock signal independent of a duty cycle result of the first indication signal Pup and the second indication signal Pdn is not reflected. In actual application, both the first indication signal Pup and the second indication signal Pdn are sampled based on the first delay clock signal WCK2TWRTR0, the second delay clock signal WCK2TWRTF0, the third delay clock signal WCK2TWRTR1, and the fourth delay clock signal WCK2TWRTF1.

A third indication signal Pup is generated based on the first clock signal WCK2TWRTR0 and the second clock signal WCK2TWRTF0 after delaying, and a fourth indication signal Pdn is generated based on the second clock signal WCK2TWRTF0 after delaying and the third delay clock signal WCK2TWRTR1. It can be known in combination with FIG. 2 that the duty cycle of the third indication signal Pup is Ts1/(Ts1+Ts2), and the duty cycle of the fourth indication signal Pdn is Ts2/(Ts1+Ts2). If the output signal of the test circuit 400 is a high level, then it indicates that the duty cycle of the third indication signal Pup is greater than the duty cycle of the fourth indication signal Pdn, that is, Ts1>TS2, at this moment, the delay to the first clock signal may be increased and simultaneously the delay to the second clock signal may be decreased, that is, Ts1 is decreased and Ts2 is increased, so that Ts1=Ts2, the total signal delay of the first clock signal and the second clock signal is constant, that is, the sum of the Ts1+Ts2 is constant to ensure that (Ts1+Ts2)=(Ts3+Ts4). If the output signal of the test circuit 400 is a low level, then it indicates that the duty cycle of the third indication signal Pup is less than the duty cycle of the fourth indication signal Pdn, that is, Ts1<TS2, at this moment, the delay to the first clock signal may be decreased and simultaneously the delay to the second clock signal may be increased, that is, Ts1 is increased and Ts2 is decreased, so that Ts1=Ts2, and the total signal delay of the first clock signal and the second clock signal is constant, that is, the sum of the Ts1+Ts2 is constant to ensure that (Ts1+Ts2)=(Ts3+Ts4).

It is to be noted that, in the abovementioned example, the sampling of the delay clock signal independent of a duty cycle result of the third indication signal Pup and the fourth indication signal Pdn is not reflected. In actual application, both the third indication signal Pup and the fourth indication signal Pdn are sampled based on the first delay clock signal WCK2TWRTR0, the second delay clock signal WCK2TWRTF0, the third delay clock signal WCK2TWRTR1, and the fourth delay clock signal WCK2TWRTF1.

A fifth indication signal Pup is generated based on the third clock signal WCK2TWRTR1 and the fourth clock signal WCK2TWRTF1 after delaying, and a sixth indication signal Pdn is generated based on the fourth clock signal WCK2TWRTF1 and the first clock signal WCK2TWRTR0 after delaying. It can be known in combination with FIG. 2 that the duty cycle of the fifth indication signal Pup is Ts3/(Ts3+Ts4), and the duty cycle of the sixth indication signal Pdn is Ts4/(Ts3+Ts4). If the output signal of the test circuit 400 is a high level, then it indicates that the duty cycle of the fifth indication signal Pup is greater than the duty cycle of the sixth indication signal Pdn, that is, Ts3>Ts4, at this moment, the delay to the third clock signal may be increased and simultaneously the delay to the fourth clock signal may be decreased, that is, Ts3 is decreased and Ts4 is increased, so that Ts3=Ts4, the total signal delay of the third clock signal and the fourth clock signal is constant, that is, the sum of the Ts3+Ts4 is constant to ensure that (Ts1+Ts2)=(Ts3+Ts4). If the output signal of the test circuit 400 is a low level, then it indicates that the duty cycle of the fifth indication signal Pup is less than the duty cycle of the sixth indication signal Pdn, that is, Ts3<Ts4, at this moment, the delay to the third clock signal may be decreased and simultaneously the delay to the fourth clock signal may be increased, that is, Ts3 is increased and Ts4 is decreased, so that Ts3=Ts4, and the total signal delay of the third clock signal and the fourth clock signal is constant, that is, the sum of the Ts3+Ts4 is constant to ensure that (Ts1+Ts2)=(Ts3+Ts4).

It is to be noted that, in the abovementioned example, the sampling of the delay clock signal independent of a duty cycle result of the fifth indication signal Pup and the sixth indication signal Pdn is not reflected. In actual application, both the fifth indication signal Pup and the sixth indication signal Pdn are sampled based on the first delay clock signal WCK2TWRTR0, the second delay clock signal WCK2TWRTF0, the third delay clock signal WCK2TWRTR1, and the fourth delay clock signal WCK2TWRTF1.

It is to be noted that the abovementioned example describes the case that the delays of the first clock signal, the second clock signal, the third clock signal, and the fourth clock signal are all adjustable. In specific implementation, a rising edge of the first clock signal WCK2TR0 needs to be aligned with the rising edge of the internal clock signal WCK_T, that is, the delay to the first clock signal WCK2TR0 cannot be adjusted. At this moment, the change of the delay to the first clock signal WCK2TR0 is ignored, and the abovementioned example is still applicable.

In the present embodiment, referring to FIG. 2 and FIG. 3, the signal loading circuit 805 includes: a data generation module 803 and a data loading module 804.

The data generation module 803 is configured to generate four-bit first loading data Data1 and second loading data Data2.

The data loading module 804 is configured to sample the first loading data Data1 to generate the first indication signal Pup according to the first delayed clock signal, the second delayed clock signal, the third delayed clock signal, or the fourth delayed clock signal. When the first loading data Data1 corresponding to a clock signal sampling edge is a high level, the generated first indication signal Pup is a high level. When the first loading data Data1 corresponding to a clock signal sampling edge is a low level, the generated first indication signal Pup is a low level.

The data loading module 804 is also configured to sample the second loading data Data2 to generate the second indication signal Pdn according to the first delayed clock signal, the second delayed clock signal, the third delayed clock signal, or the fourth delayed clock signal. When the second loading data Data2 corresponding to a clock signal sampling edge is a high level, the generated second indication signal Pdn is a high level.

For the data generation module 803, the bits of the generated first loading data Data1 and second loading data Data2 is equal to the number of the clock signals driving the data loading module 804. In the present embodiment, the data loading module 804 may be driven by four clock signals, so the first loading data Data1 and second loading data Data2 are four bits.

In some embodiments, the data generation module 803 is controlled to start based on a generation control signal. The data generation module is only started during use through control, so as to reduce the power consumption of the clock generation circuit.

In the present embodiment, the delay command includes a first delay command cmR0, a second delay command cmF0, a third delay command cmR1, and a fourth delay command cmF1. Correspondingly, the signal delay circuit 802 includes a first delay subcircuit 901, a second delay subcircuit 902, a third delay subcircuit 903, and a fourth delay subcircuit 904.

The first delay subcircuit 901 is configured to perform signal delay on the first clock signal WCK2TF0 according to the first delay command cm R0 to generate a first delay clock signal WCK2TWRTR0. The second delay subcircuit 902 is configured to perform signal delay on the second clock signal WCK2TF0 according to the second delay command cm F0 to generate a second delay clock signal WCK2TWRTF0. The third delay subcircuit 903 is configured to perform signal delay on the third clock signal WCK2TR1 according to the third delay command cm R1 to generate a third delay clock signal WCK2TWRTR1. The fourth delay subcircuit 904 is configured to perform signal delay on the fourth clock signal WCK2TF1 according to the fourth delay command cm F1 to generate a fourth delay clock signal WCK2TWRTF1.

In an example, the first delay subcircuit 901 includes: a first one-delay phase inverter 11, herein an input end is configured to receive the first clock signal WCK2TF0; a first two-delay phase inverter 812, herein an input end is connected to the first one-delay phase inverter 811; a first three-delay phase inverter 813, herein an input end is connected to the first two-delay phase inverter 812; a first four-delay phase inverter 814, herein an input end is connected to the first three-delay phase inverter 813, and an output end is configured to output the delayed first clock signal, that is, the first delay clock signal WCK2TWRTR0; a first charging and discharging module 851, herein one end is connected to the output end of the first one-delay phase inverter 811, the other end is coupled to a low-potential power node, and the low-potential power node is configured to receive a low level; a fifth charging and discharging module 855, herein one end is connected to the output end of the first two-delay phase inverter 812, and the other end is coupled to the low-potential power node. The charging and discharging capacity of the first charging and discharging module 851 and the fifth charging and discharging module 855 is adjusted according to the first delay command cm R0.

It is to be noted that, in other embodiments, the other ends of the first charging and discharging module 851 and the fifth charging and discharging module 855 may also be coupled to a high-potential power node. The high-potential power node is configured to receive a high level.

In an example, the second delay subcircuit 902 includes: a second one-delay phase inverter 821, herein an input end is configured to receive the second clock signal WCK2TF0; a second two-delay phase inverter 822, herein an input end is connected to the second one-delay phase inverter 821; a second three-delay phase inverter 823, herein an input end is connected to the second two-delay phase inverter 822; a second four-delay phase inverter 824, herein an input end is connected to the second three-delay phase inverter 823, and an output end is configured to output the delayed second clock signal, that is, the second delay clock signal WCK2TWRTF0; a second charging having discharging module 852, herein one end is connected to the output end of the second one-delay phase inverter 821, the other end is coupled to a low-potential power node, and the low-potential power node is configured to receive a low level; a sixth charging and discharging module 856, herein one end is connected to the output end of the second two-delay phase inverter 822, and the other end is coupled to the low-potential power node. The charging and discharging capacity of the second charging having discharging module 852 and the sixth charging and discharging module 856 is adjusted according to the second delay command cm F0.

It is to be noted that, in other embodiments, the other ends of the second charging having discharging module 852 and the sixth charging and discharging module 856 may also be coupled to a high-potential power node. The high-potential power node is configured to receive a high level.

In an example, the third delay subcircuit 903 includes: a third one-delay phase inverter 831, herein an input end is configured to receive the third clock signal WCK2TR1; a third two-delay phase inverter 832, herein an input end is connected to the third one-delay phase inverter 831; a third three-delay phase inverter 833, herein an input end is connected to the third two-delay phase inverter 832; a third four-delay phase inverter 834, herein an input end is connected to the third three-delay phase inverter 833, and an output end is configured to output the third clock signal after delaying, that is, the third delay clock signal WCK2TWRTR1; a third charging and discharging module 853, herein one end is connected to the third one-delay phase inverter 831, the other end is coupled to a low-potential power node, and the low-potential power node is configured to receive a low level; a seventh charging and discharging module 857, herein one end is connected to the output end of the third two-delay phase inverter 832, and the other end is coupled to the low-potential power node. The charging and discharging capacity of the third charging and discharging module 853 and the seventh charging and discharging module 857 is adjusted according to the third delay command cm R1.

It is to be noted that, in other embodiments, the other ends of the third charging and discharging module 853 and the seventh charging and discharging module 857 may also be coupled to a high-potential power node. The high-potential power node is configured to receive a high level.

In an example, the fourth delay subcircuit 904 includes: a fourth one-delay phase inverter 841, herein an input end is configured to receive the fourth clock signal WCK2TF1; a fourth two-delay phase inverter 842, herein an input end is connected to the fourth one-delay phase inverter 841; a fourth three-delay phase inverter 843, herein an input end is connected to an output end of the fourth two-delay phase inverter 842; a fourth four-delay phase inverter 844, herein an input end is connected to the fourth three-delay phase inverter 843, and an output end is configured to output the fourth clock signal after delaying, that is, the fourth delay clock signal WCK2TWRTF1; a fourth charging and discharging module 854, herein one end is connected to the output end of the fourth one-delay phase inverter 841, the other end is coupled to a low-potential power node, and the low-potential power node is configured to receive a low level; an eighth charging and discharging module 858, herein one end is connected to the output end of the fourth two-delay phase inverter 842, and the other end is coupled to the low-potential power node. The charging and discharging capacity of the fourth charging and discharging module 854 and the eighth charging and discharging module 858 is adjusted according to the fourth delay command cm F1.

It is to be noted that, in other embodiments, the other ends of the fourth charging and discharging module 854 and the eighth charging and discharging module 858 may also be coupled to a high-potential power node. The high-potential power node is configured to receive a high level.

Specifically, for the first charging and discharging module 851, the second charging having discharging module 852, the third charging and discharging module 853, and the fourth charging and discharging module 854, the more charges can be stored, the faster the discharge speed, and the higher the delay to the rising edge of the signal. For the fifth charging and discharging module 855, the sixth second charging having discharging module 856, the seventh charging and discharging module 857, and the eighth fourth charging and discharging module 858, the more charges can be stored, the faster the discharge speed, and the higher the delay to the falling edge of the signal. The charging and discharging capacity of the first charging and discharging module 851, the second charging having discharging module 852, the third charging and discharging module 853, the fourth charging and discharging module 854, the fifth charging and discharging module 855, the sixth charging and discharging module 856, the seventh charging and discharging module 857, the eighth charging and discharging module 858 is adjusted, so that the first clock signal WCK2TF0, the second clock signal WCK2TR0, a third clock signal WCK2TR1, and a fourth clock signal WCK2TF1 are delayed at different degrees.

Meanwhile, since the first charging and discharging module 851 and the fifth charging and discharging module 855 are controlled based on the same delay command, that is, a rising edge and a falling edge of the first clock signal WCK2TF0 are delayed to the same degree, so as not to change the duty cycle of the first clock signal WCK2TF0. Since the second charging having discharging module 852 and the sixth charging and discharging module 856 are controlled based on the same delay command, that is, a rising edge and a falling edge of the second clock signal WCK2TR0 are delayed to the same degree, so as not to change the duty cycle of the second clock signal WCK2TR0. Since the third charging and discharging module 853 and the seventh charging and discharging module 857 are controlled based on the same delay command, that is, a rising edge and a falling edge of the third clock signal WCK2TR1 are delayed to the same degree, so as not to change the duty cycle of the third clock signal WCK2TR1. Since the fourth charging and discharging module 854 and the eighth charging and discharging module 858 are controlled based on the same delay command, that is, a rising edge and a falling edge of the fourth clock signal WCK2TF1 are delayed to the same degree, so as not to change the duty cycle of the fourth clock signal WCK2TF1.

In the present embodiment, the first charging and discharging module 851, the second charging having discharging module 852, the third charging and discharging module 853, the fourth charging and discharging module 854, the fifth charging and discharging module 855, the sixth charging and discharging module 856, the seventh charging and discharging module 857, and the eighth charging and discharging module 858 are implemented through capacitors. The charging and discharging capacity of the capacitors depends on the maximum stored charge C and the discharge current I of the capacitors. Specifically, the discharge current I is controlled by a bias transistor, and the delay command cm controls the delay performance of the corresponding first charging and discharging module 851, second charging having discharging module 852, third charging and discharging module 853, fourth charging and discharging module 854, fifth charging and discharging module 855, sixth charging and discharging module 856, seventh charging and discharging module 857, and eighth charging and discharging module 858 by controlling the discharge current I.

It is to be noted that, in some embodiments, the low level received by the low-potential power node coupled with the first delay subcircuit 901, the second delay subcircuit 902, the third delay subcircuit 903, and the fourth delay subcircuit 904 is adjustable, so as to realize the overall adjustment of the charging and discharging capacity of the first delay subcircuit 901, the second delay subcircuit 902, the third delay subcircuit 903, and the fourth delay subcircuit 904.

In some embodiments, referring to FIG. 4, a first integrating circuit 401 for receiving the first indication signal Pup is configured to integrate the first indication signal Pup to output a first integrated signal FltNdT.

A second integrating circuit 402 for receiving the second indication signal Pdn is configured to integrate the second indication signal Pdn to output a second integrated signal FltNdT.

The first indication signal Pup and the second indication signal Pdn are reverse signals. The voltage value of the first integrated signal FltNdT is a product of the duty cycle of the first indication signal Pup and the power amplitude value, and the voltage value of the second integrated signal FltNdC is a product of the duty cycle of the second indication signal Pdn and the power amplitude value.

A comparison circuit 403 has an input end connected to the first integrating circuit 401, and the other input end connected to the second integrating circuit 402. The comparison circuit 403 is configured to compare the size of the first integrated signal FltNdT and the size of the second integrated signal FltNdC, output a high level signal when the first integrated signal FltNdT is greater than the second integrated signal FltNdC, and output a low level signal when the second integrated signal FltNdC is greater than the first integrated signal FltNdT.

Specifically, referring to FIG. 5, the first integrating circuit 401 includes: a first filter unit 501, a first pre-processing unit 510, and a second pre-processing unit 520. The first filter unit 501 is configured to integrate a received signal, that is, the first filter unit 501 is configured to integrate the first indication signal Pup.

The first pre-processing unit 510 includes: a first on-transistor <DT1>, a first pre-charge P transistor <YP1>, and a first pre-charge N transistor <YN1>. A drain of the first on-transistor <DT1> is configured to receive the first indication signal Pup, a source is connected to an input end of the first filter unit 501, and a gate is configured to receive a first switching signal PassA. A source of the first pre-charge P transistor <YP1> is configured to receive a high level, a drain is connected to an input end of the first filter unit 501, and a gate is configured to receive an integrated charge signal ClampF. A source of the first pre-charge N transistor <YN1> is configured to receive a low level, a drain is connected to an input end of the first filter unit 501, and a gate is configured to receive a first integrated discharge signal ClpGnd.

Specifically, the first switching signal PassA is used to start the first pre-processing unit 510. When the first on-transistor <DT1> is switched on through the first switching signal PassA, the first filter unit 501 receives the first indication signal Pup, and starts to integrate the first indication signal Pup. The first pre-charge P transistor <YP1> is switched on based on the integrated charge signal ClampF, so as to indirectly connect the input end of the first filter unit 501 to the high level, thereby pulling up the potential at the input end of the first filter unit 501. The first pre-charge N transistor <YN1> is switched on based on the first integrated discharge signal ClpGnd, so as to indirectly connect the input end of the first filter unit 501 to the low level, thereby pulling down the potential at the input end of the first filter unit 501.

The second pre-processing unit 520 includes: a second on-transistor <DT2>, a second pre-charge P transistor <YP2>, and a second pre-charge N transistor <YN2>. A drain of the second on-transistor <DT2> is connected to an output end of the first filter unit 501, a source is connected to output the first integrated signal FltNdT, a gate is configured to receive a second switching signal PassB. A source of the second pre-charge P transistor <YP2> is configured to receive a high level, a drain is connected to an input end of the first filter unit 501, and a gate is configured to receive an integrated charge signal ClampF. A drain of the second pre-charge N transistor <YN2> is configured to receive a low level, the drain is connected to the input end of the first filter unit 501, and a gate is configured to receive the first integrated discharge signal ClpGnd.

Specifically, the second switching signal PassB is used to start the second pre-processing unit 520. When the second on-transistor <DT2> is switched on through the second switching signal PassB, the first integrated signal FltNdT integrated and acquired by the first filter unit 501 may be output to the comparison circuit 403. The second pre-charge P transistor <YP2> is switched on based on the integrated charge signal ClampF, so as to indirectly connect the output end of the first filter unit 501 to the high level, thereby pulling up the potential at the output end of the first filter unit 501. The second pre-charge N transistor <YN2> is switched on based on the first integrated discharge signal ClpGnd, so as to indirectly connect the output end of the first filter unit 501 to the low level, thereby pulling down the potential at the output end of the first filter unit 501.

Continuing to refer to FIG. 5, the second integrating circuit 402 includes: a second filter unit 502, a third pre-processing unit 530, and a fourth pre-processing unit 540. The second filter unit 502 is configured to integrate a received signal, that is, the second filter unit 502 is configured to integrate the second indication signal Pdn.

The third pre-processing unit 530 includes: a third on-transistor <DT3>, a third pre-charge P transistor <YP3>, and a third pre-charge N transistor <YN3>. A drain of the third on-transistor <DT3> is configured to receive the second indication signal Pdn, a source is connected to an input end of the second filter unit 502, and a gate is configured to receive a first switching signal PassA. A source and a gate of the third pre-charge P transistor <YP3> are connected and are configured to receive a high level, and a drain is connected to an input end of the second filter unit 502. A source of the third pre-charge N transistor <YN3> is configured to receive a low level, a drain is connected to an input end of the second filter unit 502, and a gate is configured to receive a second integrated discharge signal Clamp.

Specifically, the first switching signal PassA is used to start the third pre-processing unit 530. When the third on-transistor <DT3> is switched on through the first switching signal PassA, the second filter unit 502 receives the second indication signal Pdn, and starts to integrate the second indication signal Pdn. The gate and the source of the third pre-charge P transistor <YP3> receive a high level simultaneously, so that the third pre-charge P transistor <YP3> is in an off state to prevent the high level from pulling up the potential at the input end of the second filter unit 502. The third pre-charge N transistor <YN3> is switched on based on the second integrated discharge signal Clamp, so as to indirectly connect the input end of the second filter unit 502 to the low level, thereby pulling down the potential at the output end of the second filter unit 502.

The fourth pre-processing unit 540 includes: a fourth on-transistor <DT3>, a fourth pre-charge P transistor <YP4>, and a fourth pre-charge N transistor <YN4>. A drain of the fourth on-transistor <DT3> is connected to an output end of the second filter unit 502, a source is configured to output the second integrated signal FltNdC, and a gate is configured to receive a second switching signal PassB. A source and a gate of the fourth pre-charge P transistor <YP4> are connected and are configured to receive a high level, a drain is connected to an output end of the second filter unit 502. A source of the fourth pre-charge N transistor <YN4> is configured to receive a low level, a drain is connected to an input end of the second filter unit 502, and a gate is configured to receive the second integrated discharge signal Clamp.

Specifically, the second switching signal PassB is used to start the fourth pre-processing unit 540. When the fourth on-transistor <DT3> is switched on through the second switching signal PassB, the second integrated signal FltNdC integrated and acquired by the second filter unit 502 may be output to the comparison circuit 403. The gate and the source of the fourth pre-charge P transistor <YP4> receive a high level simultaneously, so that the fourth pre-charge P transistor <YP4> is in an off state to prevent the high level from pulling up the potential at the output end of the second filter unit 502. The fourth pre-charge N transistor <YN4> is switched on based on the second integrated discharge signal Clamp, so as to indirectly connect the output end of the second filter unit 502 to the low level, thereby pulling down the potential at the output end of the second filter unit 502.

In some embodiments, the test circuit 400 further includes: a first equalizing circuit 521 and a second equalizing circuit 522. One end of the first equalizing circuit 521 is connected to an input end of the first integrating circuit 401, and the other end is connected to the input end of the second integrating circuit 402. The first equalizing circuit 521 is configured to make the voltages at the input ends of the first integrating circuit 401 and the second integrating circuit 402 the same based on a first equalizing signal EqA. One end of the second equalizing circuit 522 is connected to an output end of the first integrating circuit 401, and the other end is connected to the output end of the second integrating circuit 402. The second equalizing circuit 522 is configured to make the initial voltages of the first integrated signal FltNdT and the second integrated signal FltNdC the same based on a second equalizing signal EqB.

Specifically, in the embodiments of the disclosure, the first equalizing circuit 521 includes: a first equalizing P transistor <EP1> and a first equalizing N transistor <EN1>. A source of the first equalizing P transistor <EP1> and a drain of the first equalizing N transistor <EN1> are coupled to an input end of the first integrating circuit 401. A drain of the first equalizing P transistor <EP1> and a source of the first equalizing N transistor <EN1> are coupled to an input end of the second integrating circuit 402. A gate of the first equalizing P transistor <EP1> and a gate of the first equalizing N transistor <EN1> are configured to receive a first equalizing signal EqA. The second equalizing circuit 522 includes: a second equalizing P transistor <EP2> and a second equalizing N transistor <EN2>. A source of the second equalizing P transistor <EP2> and a drain of the second equalizing N transistor <EN2> are coupled to an output end of the first integrating circuit 401. A drain of the second equalizing P transistor <EP2> and a source of the second equalizing N transistor <EN2> are coupled to an output end of the second integrating circuit 402. A gate of the second equalizing P transistor <EP2> and a gate of the second equalizing N transistor <EN2> are configured to receive a second equalizing signal EqB.

In the present embodiment, continuing to refer to FIG. 5, one end of the first equalizing circuit 521 is connected to an input end of the first filter unit 501, and the other end is connected to the input end of the second integrating circuit 402. The first equalizing circuit 521 is configured to make the voltages at the input ends of the first filter unit 501 and the second filter unit 502 the same based on a first equalizing signal EqA. One end of the second equalizing circuit 522 is connected to the drain of the second on-transistor <DT2>, and the other end is connected to the drain of the fourth on-transistor <DT4>. The second equalizing circuit 522 is configured to make the initial voltages of the first integrated signal FltNdT and the second integrated signal FltNdC the same based on a second equalizing signal EqB.

It is to be noted that, for the first equalizing circuit 521 and the second equalizing circuit 522, equalizing transistors that need to be switched on may be set according to the actual requirements after the test circuit is equalized. For example, if it is required that the input ends of the first filter unit 501 and the second filter unit 502 are intermediate levels after being equalized through the first equalizing circuit 521, then the potentials at the input ends of the first filter unit 501 and the second filter unit 502 are equalized by using the first equalizing P transistor <EP1>. If it is required that the input ends of the first filter unit 501 and the second filter unit 502 are low levels after being equalized through the first equalizing circuit 521, then the potentials at the input ends of the first filter unit 501 and the second filter unit 502 are equalized by using the first equalizing N transistor <EN1>. If it is required that the initial voltages of the first integrated signal FltNdT and the second integrated signal FltNdC are intermediate levels after being equalized through the second equalizing circuit 522, then the initial voltages of the first integrated signal FltNdT and the second integrated signal FltNdC are equalized by using the second equalizing P transistor <EP2>. If it is required that the initial voltages of the first integrated signal FltNdT and the second integrated signal FltNdC are low levels after being equalized through the second equalizing circuit 522, then the initial voltages of the first integrated signal FltNdT and the second integrated signal FltNdC are equalized by using the second equalizing N transistor <EN2>.

Referring to FIG. 6, in the present embodiment, the comparison circuit 403 includes: a first input P transistor <SP1>, a second input P transistor <SP2>, a third input P transistor <SP3>, a first input N transistor <SN1>, a second input N transistor <SN2>, a third input N transistor <SN3>, a fourth input N transistor <SN4>, a first comparison P transistor <BP1>, and a second comparison P transistor <BP2>. A gate is configured to receive the first integrated signal FltNdT, a source is connected to a drain of the third input P transistor <SP3>, and a drain is connected to a source of the first comparison P transistor <BP1>. A gate of the second input P transistor <SP2> is configured to receive the second integrated signal FltNdC, a source is connected to a drain of the third input P transistor <SP3>, and a drain is connected to a source of the second comparison P transistor <BP2>. A gate of the third input P transistor <SP3> is configured to receive a comparison enabling signal CkN, and a source is configured to receive a high level signal, that is, the third input P transistor <SP3> is taken as a high level protection transistor of the comparison circuit 403 and provides a high level required for the operation of the comparison circuit 403 through the comparison enabling signal CkN. A gate of the first input N transistor <SN1> is configured to receive the comparison enabling signal CkN, a source is configured to receive a low level signal, and a drain is connected to the source of the first comparison P transistor <BP1>. A gate of the second input N transistor <SN2> is configured to receive the comparison enabling signal CkN, a source is configured to receive a low level signal, and a drain is connected to a source of the second comparison P transistor <BP2>. A gate of the third input N transistor <SN2> is configured to receive the comparison enabling signal CkN, a source is configured to receive the low level signal, and a drain is connected to the drain of the first comparison N transistor <BN1>. A gate of the fourth input N transistor <SN4> is configured to receive the comparison enabling signal CkN, a source is configured to receive the low level signal, and a source is connected to the drain of the second comparison N transistor <BN2>. A drain of the comparison P transistor <BP1> is connected to the drain of the first comparison N transistor <BN1>. A gate is connected to the drain of the second comparison N transistor <BN2>. A drain of the second comparison P transistor <BP2> is connected to the drain of the second comparison N transistor <BN2>. A gate is connected to the drain of the first comparison N transistor <BN1>. A source of the first comparison N transistor <BN1> is configured to receive a low level signal, a drain is configured to output a first comparison output signal OutP, and a gate is connected to a drain of the second comparison N transistor <BN2>. A source of the second comparison N transistor <BN2> is configured to receive a low level signal, a drain is configured to output a second comparison output signal OutN, and a gate is connected to a drain of the first comparison N transistor <BN>. One of the first comparison output signal OutP and the second comparison output signal OutN is taken as an output signal of the comparison circuit 403, and the other is taken as an reverse signal of an output signal.

Specifically, as shown in FIG. 6, a gate of the first input P transistor <SP1> is configured to receive the first integrated signal FltNdT, a gate of the second input P transistor <SP2> is configured to receive the second integrated signal FltNdC. At this moment, the comparison circuit 403 generates the first comparison output signal OutP and the second comparison output signal OutN after comparing and amplifying the first comparison output signal OutP and the second comparison output signal OutN. One of the first comparison output signal OutP and the second comparison output signal OutN is used to characterize a comparison result of the first integrated signal FltNdT and the second integrated signal FltNdC, and the other is taken as an reverse signal of the signal characterizing a comparison result.

It is to be noted that, in the present embodiment, taking the first comparison output signal OutP being used to characterize a comparison result of the first integrated signal FltNdT and the second integrated signal FltNdC, and the second comparison output signal OutN being taken as the reverse signal of the first comparison output signal OutP as an example for describing in detail, which does not constitute a limitation to the present embodiment. In other embodiments, the second comparison output result may also be used to characterize the comparison result of the first integrated signal and the second integrated signal. More specifically, for the first integrated signal FltNdT and the second integrated signal FltNdC, if an integrated value is greater than ½*power amplitude value, then the correspondingly generated first comparison output signal OutP is a high level; and if an integrated value is greater than ½*power amplitude value, then the correspondingly generated first comparison output signal OutP is a low level.

In some embodiments, referring to FIG. 7, the test circuit 400 further includes: a pre-stored circuit 600, connected to an output end of the comparison circuit 403, and configured to receive a first clock signal Clk and a second clock signal Clklat. The pre-stored circuit 600 is configured to pre-store a level signal output by the comparison circuit 403 based on the first clock signal Clk, or output the pre-stored level signal based on the second clock signal Clklat.

The pre-stored circuit 600 ensures that the signal output timing of the test circuit 400 is kept consistent with the signal output timing of a memory that the test circuit 400 belongs, so as to ensure that the test circuit 400 may be applicable to different types of memories.

In the present embodiment, referring to FIG. 7, the pre-stored circuit 600 includes a latch 601 and a register 602.

One end of the latch 601 is connected to an output end of the comparison circuit 403 and the other end is configured to receive the first clock signal Clk. The latch 601 is configured to generate an indication signal Result based on an output level of the comparison circuit when the first clock signal Clk is a valid signal.

Specifically, the latch 601 includes: a first latching NAND gate, herein one input end is configured to receive the first comparison output signal OutP, and the other input end is configured to receive the first clock signal Clk; a second latching NAND gate, herein one input end is configured to receive the second comparison output signal OutN, and the other input end is configured to receive the first clock signal Clk; a third latching NAND gate, herein one input end is connected to an output end of the first latching NAND gate, and the other input end is connected to an output end of a fourth latching NAND gate; the fourth latched NAND gate, herein one input end is connected to an output end of the second latched NAND gate, the other input end is connected to the output end of the third latching NAND gate, and the output end is configured to output the indication signal Result.

An input end D of the register 602 is connected to an output end of the latch 601, a clock end C is configured to receive a second clock signal Clklat, an enabling end RN is configured to receive an output enabling signal ComEn. The register 602 is configured to output the indication signal Result when the second clock signal Clklat and the output enabling signal ComEn are valid signals. It is to be noted that, in some embodiments, the register 603 may be set by using an FF register.

In some embodiments, the test circuit 400 further includes a control module 700. Referring to FIG. 8, the control module 700 is configured to provide control signals required for the duty cycle test of the first integrating circuit 401, the second integrating circuit 402, and the comparison circuit 403 based on the control enabling signal ControlEn.

Specifically, the control signals required for the duty cycle test of the first integrating circuit 401, the second integrating circuit 402, and the comparison circuit 403 include: a first equalizing signal EqA and a second equalizing signal EqB, an integrated charging signal ClampF, a first integrated discharging signal ClpGnd, and a second integrated discharging signal Clamp, a first switching signal PassA and a second switching signal PassB, a comparison enabling signal CkN, a first clock signal Clk, a second clock signal Clklat, and an output enabling signal ComEn.

In the present embodiment, referring to FIG. 9, the control module 700 includes: a clock unit 710, a timing unit 720, and a logical unit 730.

The clock unit 710 is configured to generate a control clock signal ControlClk on the basis of the control enabling signal ControlEn.

The timing unit 720 is connected to an output end of the clock unit 710 and stores a signal count value B. The timing unit 720 is configured to control the signal count value B to be plus one when the control enabling signal ControlEn and the control clock signal ControlClk are valid signals.

The logical unit 730 is connected to an output end of the timing unit 720, stores a control signal corresponding to the signal count value B, and is configured to provide the control signal corresponding to the signal count value B based on the signal count value B.

Specifically, the clock unit 710 is set as a ring oscillator, and the control enabling signal ControlEn is taken as an enabling signal of the ring oscillator. The signal count value B being a 7-bit signal composed of 7 bits is taken as an example, which does not constitute a limitation to the present embodiment. In actual configuration, the number of bits of the signal count value may be configured according to the actual requirements.

In the present embodiment, continuing to refer to FIG. 9, the timing unit 720 is further configured to receive a test control signal ProbeMode. When the test control signal ProbeMode is valid, at least one bit of newly added data bit Bmax is added to the signal count value B, the newly added data bit Bmax increases the change cycle of the control clock signal by adding the bit of the signal count value B, so as to control the memory in a test mode more accurately.

It is to be noted that the features disclosed in an amplifying circuit provided by the abovementioned embodiment may be freely combined without conflicts to obtain new amplifying circuit embodiments.

Another embodiment of the disclosure provides an equidistant four-phase signal generation method, which applies the clock generation circuit provided by the abovementioned embodiment, so as to acquire equidistant parallel clock signals based on an accurate duty cycle test method.

Figure 10:
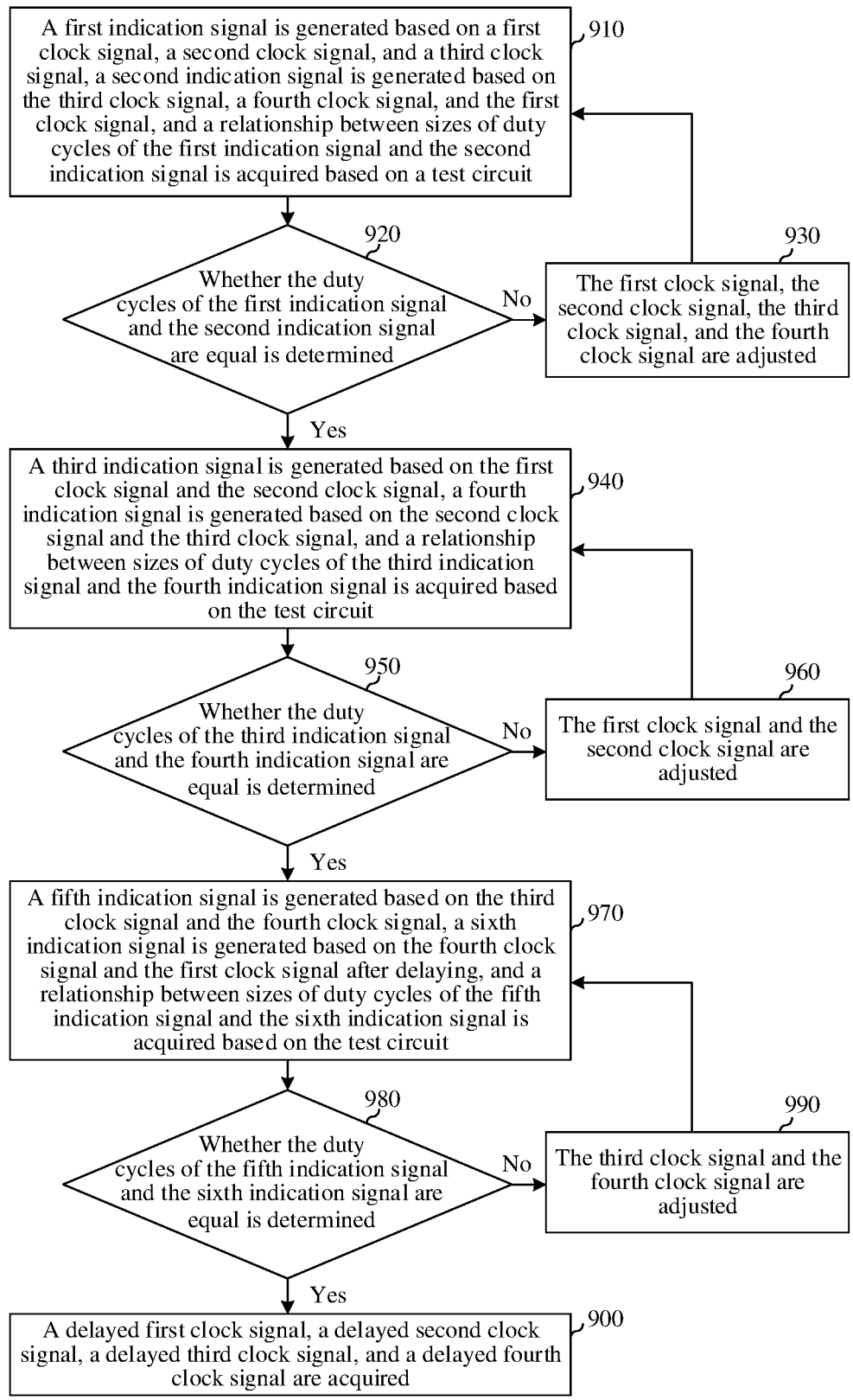
FIG. 10 illustrates a flowchart of a method for generating equidistant four-phase signals provided by an embodiment of the disclosure.

FIG. 10 illustrates a flowchart of an equidistant four-phase signal generation method provided by the present embodiment. The equidistant four-phase signal generation method provided by the present embodiment is further described in detail in combination with accompanying drawings, which are as follows specifically.

Referring to FIG. 10, an equidistant four-phase signal generation method includes the following steps.

At S910, a first indication signal is generated based on a first clock signal, a second clock signal, and a third clock signal, a second indication signal is generated based on the third clock signal, a fourth clock signal, and the first clock signal, and a relationship between sizes of duty cycles of the first indication signal and the second indication signal is acquired based on a test circuit.

Referring to FIG. 3, the first indication signal Pup is generated based on the first delay clock signal WCK2TWRTR0, the second delay clock signal WCK2TWRTF0, and the third delay clock signal WCK2TWRTR1 obtained by delaying, and the second indication signal Pdn is generated based on the third delay clock signal WCK2TWRTR1, the fourth delay clock signal WCK2TWRTF1, and the first delay clock signal WCK2TWRTR0 obtained by delaying. It can be known in combination with FIG. 2 that, at this moment, the duty cycle of the first indication signal Pup is (Ts1+Ts2)/(Ts1+Ts2+Ts3+Ts4), and the duty cycle of the second indication signal Pdn is (Ts3+Ts4)/(Ts1+Ts2+Ts3+Ts4).

It is to be noted that, in the abovementioned example, the sampling of the delay clock signal independent of a duty cycle result of the first indication signal Pup and the second indication signal Pdn is not reflected. In actual application, both the first indication signal Pup and the second indication signal Pdn are sampled based on the first delay clock signal WCK2TWRTR0, the second delay clock signal WCK2TWRTF0, the third delay clock signal WCK2TWRTR1, and the fourth delay clock signal WCK2TWRTF1.

At S920, whether the duty cycles of the first indication signal and the second indication signal are equal is determined.

Specifically, if a duty cycle of the first indication signal is different from a duty cycle of the second indication signal, S930 is executed; and if the duty cycles of the first indication signal and the second indication signal are the same, S940 is executed.

At S930, the first clock signal, the second clock signal, the third clock signal, and the fourth clock signal are adjusted.

Specifically, the delays to the first clock signal, the second clock signal, and the third clock signal are adjusted based on a delay command, and S910 is executed again based on the first clock signal, the second clock signal, and the third clock signal with the adjusted delays.

More specifically, if the output signal of the test circuit 400 is a high level, the duty cycle of the first indication signal Pup is greater than the duty cycle of the second indication signal Pdn, that is, (Ts1+Ts2)>(Ts3+Ts4), at this moment, the delay to the first clock signal may be increased and simultaneously the delays to the second clock signal and the third clock signal may be decreased, that is, Ts1+Ts2 is decreased and Ts3+Ts4 is increased, so that the (Ts1+Ts2)=(Ts3+Ts4), and the sum of the Ts1+Ts2+Ts3+Ts4 is constant to not change the overall cycle of the four-phase clock signal. If the output signal of the test circuit 400 is a low level, the duty cycle of the first indication signal Pup is less than the duty cycle of the second indication signal Pdn, that is, (Ts1+Ts2)<(Ts3+Ts4), at this moment, the delay to the first clock signal may be decreased and simultaneously the delays to the second clock signal and the third clock signal may be increased, that is, Ts1+Ts2 is increased and Ts3+Ts4 is decreased, so that the (Ts1+Ts2)=(Ts3+Ts4), and the sum of the Ts1+Ts2+Ts3+Ts4 is constant to not change the overall cycle of the four-phase clock signal.

At S940, a third indication signal is generated based on the first clock signal and the second clock signal, a fourth indication signal is generated based on the second clock signal and the third clock signal, and a relationship between sizes of duty cycles of the third indication signal and the fourth indication signal is acquired based on the test circuit.

Referring to FIG. 3, a third indication signal Pup is generated based on the first clock signal WCK2TWRTR0 and the second clock signal WCK2TWRTF0 after delaying, and a fourth indication signal Pdn is generated based on the second clock signal WCK2TWRTF0 and the third delay clock signal WCK2TWRTR1 after delaying. It can be known in combination with FIG. 2 that the duty cycle of the third indication signal Pup is Ts1/(Ts1+Ts2), and the duty cycle of the fourth indication signal Pdn is Ts2/(Ts1+Ts2).

It is to be noted that, in the abovementioned example, the sampling of the delay clock signal independent of a duty cycle result of the third indication signal Pup and the fourth indication signal Pdn is not reflected. In actual application, both the third indication signal Pup and the fourth indication signal Pdn are sampled based on the first delay clock signal WCK2TWRTR0, the second delay clock signal WCK2TWRTF0, the third delay clock signal WCK2TWRTR1, and the fourth delay clock signal WCK2TWRTF1.

At S950, whether the duty cycles of the third indication signal and the fourth indication signal are equal is determined.

Specifically, if a duty cycles of the third indication signal is different from a duty cycle of the fourth indication signal, S960 is executed; and if the duty cycles of the third indication signal and the fourth indication signal are the same, S970 is executed.

At S960, the first clock signal and the second clock signal are adjusted.

Specifically, the delays of the signal delay circuit to the first clock signal and the second clock signal are adjusted based on a delay command, and S940 is executed again based on the first clock signal and the second clock signal with adjusted delays.

More specifically, if the output signal of the test circuit 400 is a high level, then it indicates that the duty cycle of the third indication signal Pup is greater than the duty cycle of the fourth indication signal Pdn, that is, Ts1>TS2, at this moment, the delay to the first clock signal may be increased and simultaneously the delay to the second clock signal may be decreased, that is, Ts1 is decreased and Ts2 is increased, so that Ts1=Ts2, the total signal delay of the first clock signal and the second clock signal is constant, that is, the sum of the Ts1+Ts2 is constant to ensure that (Ts1+Ts2)=(Ts3+Ts4). If the output signal of the test circuit 400 is a low level, then it indicates that the duty cycle of the third indication signal Pup is less than the duty cycle of the fourth indication signal Pdn, that is, Ts1<TS2, at this moment, the delay to the first clock signal may be decreased and simultaneously the delay to the second clock signal may be increased, that is, Ts1 is increased and Ts2 is decreased, so that Ts1=Ts2, and the total signal delay of the first clock signal and the second clock signal is constant, that is, the sum of the Ts1+Ts2 is constant to ensure that (Ts1+Ts2)=(Ts3+Ts4).

At S970, a fifth indication signal is generated based on the third clock signal and the fourth clock signal, a sixth indication signal is generated based on the fourth clock signal and the delayed first clock signal, and a relationship between sizes of duty cycles of the fifth indication signal and the sixth indication signal is acquired based on the test circuit.

Referring to FIG. 3, a fifth indication signal Pup is generated based on the third clock signal WCK2TWRTR1 and the fourth clock signal WCK2TWRTF1 after delaying, and a sixth indication signal Pdn is generated based on the fourth clock signal WCK2TWRTF1 and the first clock signal WCK2TWRTR0 after delaying. It can be known in combination with FIG. 2 that the duty cycle of the fifth indication signal Pup is Ts3/(Ts3+Ts4), and the duty cycle of the sixth indication signal Pdn is Ts4/(Ts3+Ts4).

It is to be noted that, in the abovementioned example, the sampling of the delay clock signal independent of a duty cycle result of the fifth indication signal Pup and the sixth indication signal Pdn is not reflected. In actual application, both the fifth indication signal Pup and the sixth indication signal Pdn are sampled based on the first delay clock signal WCK2TWRTR0, the second delay clock signal WCK2TWRTF0, the third delay clock signal WCK2TWRTR1, and the fourth delay clock signal WCK2TWRTF1.

At S980, whether the duty cycles of the fifth indication signal and the sixth indication signal are equal is determined.

Specifically, if a duty cycle of the fifth indication signal is different from a duty cycle of the sixth indication signal, S990 is executed; and if the duty cycles of the fifth indication signal and the sixth indication signal are the same, S900 is executed.

At S990, the third clock signal and the fourth clock signal are adjusted.

Specifically, the delays of the signal delay circuit to the third clock signal and the fourth clock signal are adjusted based on a delay command, and S970 is executed again based on the third clock signal and the fourth clock signal with adjusted delays.

More specifically, if the output signal of the test circuit 400 is a high level, then it indicates that the duty cycle of the fifth indication signal Pup is greater than the duty cycle of the sixth indication signal Pdn, that is, Ts3>Ts4, at this moment, the delay to the third clock signal may be increased and the delay to the fourth clock signal may be decreased, that is, Ts3 is decreased and Ts4 is increased, so that Ts3=Ts4, the total signal delay of the third clock signal and the fourth clock signal is constant, that is, the sum of the Ts3+Ts4 is constant to ensure that (Ts1+Ts2)=(Ts3+Ts4). If the output signal of the test circuit 400 is a low level, then it indicates that the duty cycle of the fifth indication signal Pup is less than the duty cycle of the sixth indication signal Pdn, that is, Ts3<Ts4, at this moment, the delay to the third clock signal may be decreased and the delay to the fourth clock signal may be increased, that is, Ts3 is increased and Ts4 is decreased, so that Ts3=Ts4, and the total signal delay of the third clock signal and the fourth clock signal is constant, that is, the sum of the Ts3+Ts4 is constant to ensure that (Ts1+Ts2)=(Ts3+Ts4).

At S900, the first clock signal, the second clock signal, the third clock signal, and the fourth clock signal after delaying are acquired.

At this moment, the signal delays between every two of the acquired first clock signal, second clock signal, third clock signal, and fourth clock signal after delaying are the same, that is, Ts1=Ts2=Ts3=Ts4, and the first clock signal, the second clock signal, the third clock signal, and the fourth clock signal are equidistant four phase clocks.

Another embodiment of the disclosure provides a memory, which is applied to the clock generation circuit provided by the abovementioned embodiments to generate a first clock signal, a second clock signal, a third clock signal, and a fourth clock signal with an equal delay and the same duty cycle, so as to acquire equidistant parallel clock signals based on an accurate duty cycle test method.

In some embodiments, the memory is a Dynamic Random Access Memory (DRAM) chip, herein the memory of the DRAM chip conforms to the specification of a memory DDR2.

In some embodiments, the memory is a DRAM chip, herein the memory of the DRAM chip conforms to the specification of a memory DDR3.

In some embodiments, the memory is a DRAM chip, herein the memory of the DRAM chip conforms to the specification of a memory DDR4.

In some embodiments, the memory is a DRAM chip, herein the memory of the DRAM chip conforms to the specification of a memory DDR5.

The embodiments of the disclosure further provide a memory, which is applied to the clock generation circuit provided by the abovementioned embodiments to generate a first clock signal, a second clock signal, a third clock signal, and a fourth clock signal with an equal delay and the same duty cycle, so as to acquire equidistant parallel clock signals based on an accurate duty cycle test method.

Those skilled in the art can understand that the above-mentioned embodiments are specific embodiments to implement the disclosure. In practical application, various changes can be made in forms and details without departing from the spirit and scope of the disclosure.

The invention claimed is:

1. A clock generation circuit, comprising:
    a four-phase clock generation circuit for receiving an internal clock signal and a complementary clock signal of a memory to which the clock generation circuit belongs, configured to generate a first clock signal, a second clock signal, a third clock signal, and a fourth clock signal with a same cycle based on the internal clock signal and the complementary clock signal, wherein
        the internal clock signal and the complementary clock signal are reverse signals, a cycle of the first clock signal is K times a cycle of the internal clock signal, K is a positive integer, and a value of K depends on a signal delay inside the four-phase clock generation circuit;

a signal delay circuit for receiving the first clock signal, the second clock signal, the third clock signal, the fourth clock signal, and a delay command, configured to perform signal delay on the first clock signal, the second clock signal, the third clock signal, and the fourth clock signal respectively based on the delay command, wherein delays of the first clock signal, the second clock signal, the third clock signal, and the fourth clock signal are different;

a signal loading circuit, connected to the signal delay circuit, and configured to generate a first indication signal and a second indication signal based on the delayed first clock signal, the delayed second clock signal, the delayed third clock signal, and the delayed fourth clock signal; and a test circuit, connected to the signal loading circuit, and configured to perform a duty cycle test based on the first indication signal and the second indication signal.

2. The clock generation circuit of claim 1, wherein the delay command comprises a first delay command, a second delay command, a third delay command, and a fourth delay command;

the signal delay circuit comprises a first delay subcircuit, a second delay subcircuit, a third delay subcircuit, and a fourth delay subcircuit;

the first delay subcircuit is configured to perform signal delay on the first clock signal according to the first delay command, the second delay subcircuit is configured to perform signal delay on the second clock signal according to the second delay command, the third delay subcircuit is configured to perform signal delay on the third clock signal according to the third delay command, and the fourth delay subcircuit is configured to perform signal delay on the fourth clock signal according to the fourth delay command.

3. The clock generation circuit of claim 2, wherein the first delay subcircuit comprises:

a first one-delay phase inverter having an input end configured to receive the first clock signal;

a first two-delay phase inverter having an input end connected to an output end of the first one-delay phase inverter;

a first three-delay phase inverter having an input end connected to an output end of the first two-delay phase inverter;

a first four-delay phase inverter having an input end connected to an output end of the first three-delay phase inverter, and having an output end configured to output the delayed first clock signal;

a first charging and discharging module having an end connected to the output end of the first one-delay phase inverter, and having another end coupled to a low-potential power node, wherein the low-potential power node is configured to receive a low level; and a fifth charging and discharging module having an end connected to the output end of the first two-delay phase inverter, and having another end coupled to the low-potential power node, wherein charging and discharging capacity of the first charging and discharging module and the fifth charging and discharging module is adjusted according to the first delay command.

4. The clock generation circuit of claim 2, wherein the second delay subcircuit comprises:

a second one-delay phase inverter having an input end configured to receive the second clock signal;

a second two-delay phase inverter having an input end connected to an output end of the second one-delay phase inverter;

a second three-delay phase inverter having an input end connected to an output end of the second two-delay phase inverter;

a second four-delay phase inverter having an input end connected to an output end of the second three-delay phase inverter, and having an output end configured to output the delayed second clock signal;

a second charging and discharging module having an end connected to the output end of the second one-delay phase inverter, and having another end coupled to a low-potential power node, wherein the low-potential power node is configured to receive a low level; and a sixth charging and discharging module having an end connected to the output end of the second two-delay phase inverter, and having another end coupled to the low-potential power node, wherein charging and discharging capacity of the second charging and discharging module and the sixth charging and discharging module is adjusted according to the second delay command.

5. The clock generation circuit of claim 2, wherein the third delay subcircuit comprises:

a third one-delay phase inverter having an input end configured to receive the third clock signal;

a third two-delay phase inverter having an input end connected to an output end of the third one-delay phase inverter;

a third three-delay phase inverter having an input end connected to an output end of the third two-delay phase inverter;

a third four-delay phase inverter having an input end connected to an output end of the third three-delay phase inverter, and having an output end configured to output the delayed third clock signal;

a third charging and discharging module having an end connected to the output end of the third one-delay phase inverter, and having another end coupled to a low-potential power node, wherein the low-potential power node is configured to receive a low level; and a seventh charging and discharging module having an end connected to the output end of the third two-delay phase inverter, and having another end coupled to the low-potential power node, wherein charging and discharging capacity of the third charging and discharging module and the seventh charging and discharging module is adjusted according to the third delay command.

6. The clock generation circuit of claim 2, wherein the fourth delay subcircuit comprises:

a fourth one-delay phase inverter having an input end configured to receive the fourth clock signal;

a fourth two-delay phase inverter having an input end connected to an output end of the fourth one-delay phase inverter;

a fourth three-delay phase inverter having an input end connected to an output end of the fourth two-delay phase inverter;

a fourth four-delay phase inverter having an input end connected to an output end of the fourth three-delay phase inverter, and having an output end configured to output the delayed fourth clock signal;

a fourth charging and discharging module having an end connected to the output end of the fourth one-delay phase inverter, and having another end coupled to a low-potential power node, wherein the low-potential power node is configured to receive a low level; and an eighth charging and discharging module having an end connected to the output end of the fourth two-delay phase inverter, and having another end coupled to the low-potential power node, wherein charging and discharging capacity of the fourth charging and discharging module and the eighth charging and discharging module is adjusted according to the fourth delay command.

7. The clock generation circuit of claim 1, wherein the signal loading circuit comprises:

a data generation module, configured to generate four-bit first loading data and second loading data;

a data loading module, configured to sample the first loading data to generate the first indication signal according to the delayed first clock signal, the delayed second clock signal, the delayed third clock signal, or the delayed fourth clock signal, wherein when the first loading data corresponding to a clock signal sampling edge is a high level, the generated first indication signal is a high level; and the data loading module is also configured to sample the second loading data to generate the second indication signal according to the delayed first clock signal, the delayed second clock signal, the delayed third clock signal, or the delayed fourth clock signal, wherein when the second loading data corresponding to the clock signal sampling edge is a high level, the generated second indication signal is a high level.

8. The clock generation circuit of claim 1, wherein the test circuit comprises:

a first integrating circuit for receiving the first indication signal, configured to integrate a first test signal to output a first integrated signal;

a second integrating circuit for receiving the second indication signal, configured to integrate a second test signal to output a second integrated signal, wherein a voltage value of the first integrated signal is a product of a duty cycle of the first indication signal and a power amplitude value, and a voltage value of the second integrated signal is a product of the duty cycle of the second indication signal and the power amplitude value;

a comparison circuit having an input end connected to the first integrating circuit, and having another input end connected to the second integrating circuit; and the comparison circuit is configured to compare a size of the first integrated signal and a size of the second integrated signal, output a high level signal when the first integrated signal is greater than the second integrated signal, and output a low level signal when the second integrated signal is greater than the first integrated signal.

9. The clock generation circuit of claim 1, wherein a first integrating circuit of the test circuit comprises: a first filter unit, a first pre-processing unit, and a second pre-processing unit, wherein the first filter unit is configured to integrate a received signal;

the first pre-processing unit comprises:

a first on-transistor, a first pre-charge P transistor, and a first pre-charge N transistor;

a drain of the first on-transistor is configured to receive the first indication signal, a source of the first on-transistor is connected to an input end of the first filter unit, and a gate of the first on-transistor is configured to receive a first switching signal; a source of the first pre-charge P transistor is configured to receive a high level, a drain of the first pre-charge P transistor is connected to the input end of the first filter unit, and a gate of the first pre-charge P transistor is configured to receive an integrated charge signal; a source of the first pre-charge N transistor is configured to receive a low level, a drain of the first pre-charge N transistor is connected to the input end of the first filter unit, and a gate of the first pre-charge N transistor is configured to receive a first integrated discharge signal;

the second pre-processing unit comprises:

a second on-transistor, a second pre-charge P transistor, and a second pre-charge N transistor;

a drain of the second on-transistor is connected to an output end of the first filter unit, a source of the second on-transistor is configured to output a first integrated signal, and a gate of the second on-transistor is configured to receive a second switching signal; a source of the second pre-charge P transistor is configured to receive a high level, a drain of the second pre-charge P transistor is connected to the output end of the first filter unit, and a gate of the second pre-charge P transistor is configured to receive the integrated charge signal; and a source of the second pre-charge N transistor is configured to receive a low level, a drain of the second pre-charge N transistor is connected to the input end of the first filter unit, and a gate of the second pre-charge N transistor is configured to receive the first integrated discharge signal.

10. The clock generation circuit of claim 1, wherein a second integrating circuit of the test circuit comprises: a second filter unit, a third pre-processing unit, and a fourth pre-processing unit, wherein the second filter unit is configured to integrate a received signal;

the third pre-processing unit comprises:

a third on-transistor, a third pre-charge P transistor, and a third pre-charge N transistor;

a drain of the third on-transistor is configured to receive the second indication signal, a source of the third on-transistor is connected to an input end of the second filter unit, and a gate of the third on-transistor is configured to receive a first switching signal; a source and a gate of the third pre-charge P transistor are connected and are configured to receive a high level, and a drain of the third pre-charge P transistor is connected to the input end of the second filter unit; a source of the third pre-charge N transistor is configured to receive a low level, a drain of the third pre-charge N transistor is connected to the input end of the second filter unit, and a gate of the third pre-charge N transistor is configured to receive a second integrated discharge signal;

the fourth pre-processing unit comprises:

a fourth on-transistor, a fourth pre-charge P transistor, and a fourth pre-charge N transistor;

a drain of the fourth on-transistor is connected to an output end of the second filter unit, a source of the fourth on-transistor is configured to output a second integrated signal, and a gate of the fourth on-transistor is configured to receive a second switching signal; a source and a gate of the fourth pre-charge P transistor are connected and are configured to receive a high level, a drain of the fourth pre-charge P transistor is connected to the output end of the second filter unit; and a source of the fourth pre-charge N transistor is configured to receive a low level, a drain of the fourth pre-charge N transistor is connected to the input end of the second filter unit, and a gate of the fourth pre-charge N transistor is configured to receive the second integrated discharge signal.

11. An equidistant four-phase signal generation method, applied to the clock generation circuit of claim 1, comprising:

generating the first indication signal based on the first clock signal, the second clock signal, and the third clock signal, generating the second indication signal based on the third clock signal, the fourth clock signal, and the first clock signal, and acquiring a relationship between sizes of duty cycles of the first indication signal and the second indication signal based on the test circuit;

when the duty cycle of the first indication signal is different from the duty cycle of the second indication signal, adjusting the delay of the first clock signal, the second clock signal, and the third clock signal performed by the signal delay circuit based on the delay command;

generating a third indication signal based on the first clock signal and the second clock signal, generating a fourth indication signal based on the second clock signal and the third clock signal, and acquiring a relationship between sizes of duty cycles of the third indication signal and the fourth indication signal based on the test circuit;

when the duty cycle of the third indication signal is different from the duty cycle of the fourth indication signal, adjusting the delay of the first clock signal and the second clock signal performed by the signal delay circuit based on the delay command;

generating a fifth indication signal based on the third clock signal and the fourth clock signal, generating a sixth indication signal based on the fourth clock signal and the first clock signal, and acquiring a relationship between sizes of duty cycles of the fifth indication signal and the sixth indication signal based on the test circuit; and when the duty cycle of the fifth indication signal is different from the duty cycle of the sixth indication signal, adjusting the delay of the third clock signal and the fourth clock signal performed by the signal delay circuit based on the delay command.

12. The equidistant four-phase signal generation method of claim 11, wherein the adjusting the delay of the first clock signal, the second clock signal, and the third clock signal performed by the signal delay circuit based on the delay command comprises:

increasing the delay to the first clock signal and simultaneously decreasing the delays to the second clock signal and the third clock signal when an output signal of the test circuit is a high level; and decreasing the delay to the first clock signal and simultaneously increasing the delays to the second clock signal and the third clock signal when the output signal of the test circuit is a low level.

13. The equidistant four-phase signal generation method of claim 11, wherein the adjusting the delay of the first clock signal and the second clock signal performed by the signal delay circuit based on the delay command comprises:

increasing the delay to the first clock signal and simultaneously decreasing the delay to the second clock signal when an output signal of the test circuit is a high level; and decreasing the delay to the first clock signal and simultaneously increasing the delay to the second clock signal when the output signal of the test circuit is a low level, wherein a total signal delay of the first clock signal and the second clock signal is constant.

14. The equidistant four-phase signal generation method of claim 11, wherein the adjusting the delay of the third clock signal and the fourth clock signal performed by the signal delay circuit based on the delay command comprises:

decreasing the delay to the third clock signal and simultaneously increasing the delay to the fourth clock signal when an output signal of the test circuit is a high level; and increasing the delay to the third clock signal and simultaneously decreasing the delay to the fourth clock signal when the output signal of the test circuit is a low level, wherein a total signal delay of the third clock signal and the fourth clock signal is constant.

15. A memory, wherein the first clock signal, the second clock signal, the third clock signal, and the fourth clock signal with a same delay and a same duty cycle are generated based on the clock generation circuit of claim 1.

* * * * *